United States Patent [19]
Petschauer et al.

[11] Patent Number: 5,555,506
[45] Date of Patent: Sep. 10, 1996

[54] METHOD OF FABRICATING IC CHIPS WITH EQUATION ESTIMATED STATISTICAL CROSSTALK VOLTAGES BEING LESS THAN NOISE MARGIN

[75] Inventors: Richard J. Petschauer, Edina, Minn.; Roland D. Rothenberger, Poway, Calif.; Paul G. Tumms, Fridley, Minn.

[73] Assignee: Unisys Corporation, Blue Bell, Pa.

[21] Appl. No.: 385,849

[22] Filed: Feb. 9, 1995

[51] Int. Cl.$^6$ .............................. G06F 17/50; G06F 17/10
[52] U.S. Cl. ........................... 364/491; 364/489; 364/578
[58] Field of Search ..................................... 364/488, 489, 364/490, 491, 578, 468

[56] References Cited

U.S. PATENT DOCUMENTS

| | | | |
|---|---|---|---|
| 4,694,403 | 9/1987 | Nomura | 364/488 |
| 5,010,493 | 4/1991 | Matsumoto et al. | 364/490 |
| 5,198,986 | 3/1993 | Ikeda et al. | 364/489 |
| 5,313,398 | 5/1994 | Rohrer et al. | 364/468 |
| 5,379,231 | 1/1995 | Pillage et al. | 364/488 |
| 5,392,222 | 2/1995 | Noble | 364/490 |
| 5,446,562 | 8/1995 | Sato | 359/59 |
| 5,502,644 | 3/1996 | Hamilton et al. | 364/488 |

OTHER PUBLICATIONS

David L. Rude, "Statistical Method of Noise Estimation in a Synchronous System," IEEE Transaction on Computers, Packaging, and Manufacturing, Part B, vol. 17, No. 4, pp. 514–519, Nov. 1994.

Goel et al., "Modelling of Cross. Talk among the GaAs--based VLSI Interconnections", IEE Proceedings, vol. 136, Pt. 6, No. 6, pp. 361–368, Dec. 1989.

Kuntal Joardar, "A Simple Approach to Modeling Cross–Talk in IC", IEEE J. of Solid States Circuits, vol. 29, No. 10, pp. 1212–1219, Oct. 1994.

Primary Examiner—Kevin J. Teska
Assistant Examiner—Thai Phan
Attorney, Agent, or Firm—Charles J. Fassbender; Mark T. Starr; Steven R. Petersen

[57] ABSTRACT

Within an integrated circuit chip, digital logic gates are intercoupled by signal lines called nets. If one net (called the "victim net") has several segments that respectively lie next to several other nets (called "aggressor nets"), then a certain amount of crosstalk voltage will be coupled into the victim net by each of the aggressor nets; and that can cause a malfunction. But with the present invention, a process is provided whereby an integrated circuit chip is physically laid out and built such that the total crosstalk voltage which is coupled into the victim net by all of the aggressor nets is kept within an acceptable level. This process includes a repetitive cycle where during each cycle, a previously tried layout is modified, and the crosstalk which is coupled into the victim net in the modified layout is estimated by means of an equation. In one embodiment, the equation estimates the mean crosstalk voltage which is coupled by each aggressor net separately; and in each repetitive cycle, the estimation is made separately for each aggressor net. In another embodiment, a different equation estimated the total mean crosstalk voltage which all of the aggressor nets together couple into the victim net; and in each repetitive cycle, this estimation is made only a single time.

27 Claims, 22 Drawing Sheets

182 —
- $V_{p*}$ = PEAK CROSSTALK VOLTAGE PER MILLIMETER OF ADJACENCY BETWEEN VICTIM AND AGGRESSOR NETS
- $C_{v*}$ = VICTIM LINE CAPACITANCE PER MILLIMETER
- $C_{c*}$ = COUPLING CAPACITANCE PER MILLIMETER OF ADJACENCY BETWEEN VICTIM AND AGGRESSOR NETS
- $R_{L*}$ = VICTIM LINE RESISTANCE PER MILLIMETER
- $R_O$ = VICTIM NET DRIVER OUTPUT RESISTANCE
- $L_V$ = VICTIM NET LENGTH
- $\Delta T$ = TIME FOR VOLTAGE TRANSITION TO OCCUR FROM 10% $V_S$ TO 90% $V_S$
- $V_S$ = MAGNITUDE OF VOLTAGE TRANSITION ON AGGRESSOR NET

183 —
- $V_{P1} = (V_{P2*})(L_{C1})$
- $V_{P2} = (V_{P2*})(L_{C2})$
- ETC

184 — $V_{PT} = V_{P1} + V_{P2} + \cdots$

FIG. 5A

ROUT=500 OHMS & V_s=3.3 VOLTS

| VICTIM LENGTH (mm) | AGGRESSOR TRANSITION TIME (PSEC) | | | | | | |
|---|---|---|---|---|---|---|---|
| | 200 | 400 | 600 | 800 | 1000 | 1500 | 2000 |
| 1 | 180 | 120 | 92 | 75 | 63 | 46 | 36 |
| 10 | 580 | 500 | 450 | 410 | 380 | 320 | 280 |

41 → (1 row)
42 → (10 row)
43 ← 44 ← 45 ← 46 ← 47 ← 48 ← 49 ←

FIG. 5B

4X-INV { TRISE = 110 PS + 1100 PS/PF + 203 PS/NS TF ← 51A
         TFALL = 71 PS + 1185 PS/PF + 193 PS/NS TR ← 51B

8X-INV { TRISE = 125 PS + 565 PS/PF + 185 PS/NS TF ← 52A
         TFALL = 107 PS + 589 PS/PF + 175 PS/NS TR ← 52B

4X-NAND { TRISE = 89 PS + 306 PS/PF + 59 PS/NS TF ← 53A
          (4 INPUITS SWITCHING IN PARALLEL)
          TFALL = 171 PS + 1565 PS/PF + 136 PS/NS TR ← 53B

4X-NOR { TRISE = 220 PS + 1523 PS/PF + 134 PS/NS TF ← 54A
         TFALL = 65 PS + 313 PS/PF + 39 PS/NS TR ← 54B
         (4 INPUITS SWITCHING IN PARALLEL)

T1   T2   T3

61 → $V_p = K(e^{-X} - e^{-Y})$ $X = \dfrac{a \log(a/b)}{a-b}$, $Y = \dfrac{b \log(a/b)}{a-b}$, $K = \dfrac{ab C_C V_S (R_O + R_L/2)}{b-a}$ where $a = \dfrac{2.197}{\Delta T}$, $b = \dfrac{1}{(R_O + R_L/2) C_W}$ $V_S$ = MAGNITUDE OF AGGRESSOR VOLTAGE TRANSITION
$\Delta T$ = TIME FOR AGGRESSOR VOLTAGE TRANSITION TO OCCUR FROM 10% $V_S$ TO 90% $V_S$
$R_O$ = VICTIM NET DRIVER OUTPUT RESISTANCE
$R_L$ = VICTIM LINE RESISTANCE
$C_W$ = VICTIM LINE CAPACITANCE
$C_C$ = COUPLING CAPACITANCE

FIG. 6

| | | VICTIM NET LENGTH—mm | | | | | |
|---|---|---|---|---|---|---|---|
| ROUT | ΔT | 1 | 2 | 5 | 10 | 20 | 40 | 80 |
| 1000 | 800 | 1.0045 | 0.9986 | 0.9783 | 0.9510 | 0.9251 | 0.9298 | 0.9640 |
| 1000 | 200 | 1.0038 | 0.9919 | 0.9687 | 0.9466 | 0.9483 | 0.9704 | 0.9884 |
| 200 | 400 | 1.0143 | 0.9820 | 0.9349 | 0.8977 | 0.8952 | 0.9337 | 0.9740 |
| 100 | 800 | 1.0188 | 0.9745 | 0.9425 | 0.9013 | 0.8805 | 0.9033 | 0.9542 |
| 100 | 200 | 0.9840 | 0.9650 | 0.9097 | 0.8851 | 0.9067 | 0.9552 | 0.9849 |
| 25 | 200 | 1.0053 | 0.9575 | 0.9015 | 0.8783 | 0.9015 | 0.9532 | 0.9845 |

$V_P$ DIVIDED BY SPICE PEAK VOLTAGE

FIG. 7

$$X = \frac{a \log(a/b)}{a-b}, \quad Y = \frac{b \log(a/b)}{a-b}, \quad K = \frac{abC_C V_S (R_0 + R_L/2)}{b-a}$$

$$\text{where } a = \frac{2.197}{\Delta T}, \quad b = \frac{1}{(R_0 + R_L/2)C_N} \longleftarrow 100$$

⎫ 63a $V_S$ = MAGNITUDE OF AGGRESSOR VOLTAGE TRANSITION $\Delta T$ = TIME FOR AGGRESSOR VOLTAGE TRANSITION TO OCCUR FROM 10% $V_S$ TO 90% $V_S$ $R_0$ = VICTIM NET DRIVER OUTPUT RESISTANCE $R_L$ = VICTIM LINE RESISTANCE ⟵ 101

$C_N$ = VICTIM LINE CAPACITANCE PLUS ANY ADDITIONAL CAPACITANCE OF VICTIM NET $C_C$ = COUPLING CAPACITANCE

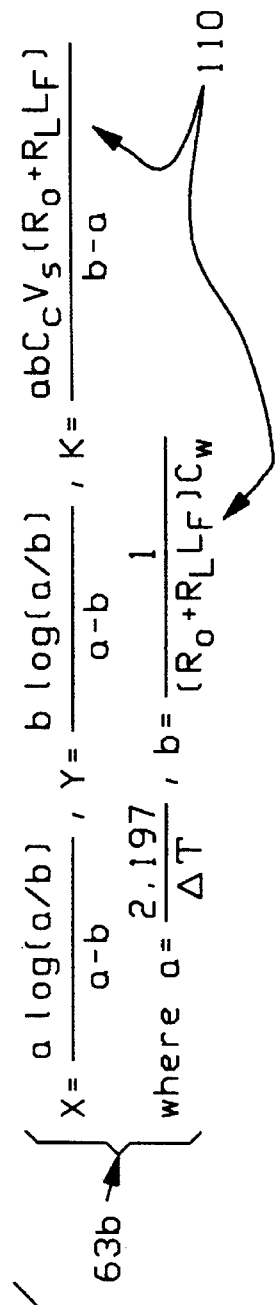

$$X = \frac{a \log(a/b)}{a-b}, \quad Y = \frac{b \log(a/b)}{a-b}, \quad K = \frac{abC_C V_S (R_O + R_L L_F)}{b-a}$$

$$\text{where } a = \frac{2.197}{\Delta T}, \quad b = \frac{1}{(R_O + R_L L_F) C_W}$$

63b $V_S$ = MAGNITUDE OF AGGRESSOR VOLTAGE TRANSITION $\Delta T$ = TIME FOR AGGRESSOR VOLTAGE TRANSITION TO OCCUR FROM 10% $V_S$ TO 90% $V_S$ $R_O$ = VICTIM NET DRIVER OUTPUT RESISTANCE $R_L$ = VICTIM LINE RESISTANCE $C_V$ = VICTIM LINE CAPACITANCE $C_C$ = COUPLING CAPACITANCE $L_F = (L_Y - D_C)/L_Y$ ← 111

$L_Y$ = LENGTH OF VICTIM LINE ← 112

$D_C$ = DISTANCE FROM LOAD FURTHEST FROM DRIVER ON VICTIM LINE TO $C_C$ ← 113

63d:
$$X = \frac{a \log(a/b)}{a-b}, \quad Y = \frac{b \log(a/b)}{a-b}, \quad K = \frac{abC_cV_s(R_o'+R_L/2)}{b-a}$$

$$a = \frac{2.197}{\Delta T}, \quad b = \frac{1}{(R_o+R_L/2.5)(C_w+C_o'+C_L)}, \quad C_o' = \frac{C_o(R_o)}{1.5R_L+R_o}$$

62d:
- $V_S$ = MAGNITUDE OF AGGRESSOR VOLTAGE TRANSITION
- $\Delta T$ = TIME FOR AGGRESSOR VOLTAGE TRANSITION TO OCCUR FROM 10% $V_S$ TO 90% $V_S$
- $R_O$ = VICTIM NET DRIVER OUTPUT RESISTANCE
- $R_L$ = VICTIM LINE RESISTANCE
- $C_W$ = VICTIM LINE CAPACITANCE
- $C_C$ = COUPLING CAPACITANCE
- $C_L$ = LOAD INPUT CAPACITANCE ON VICTIM LINE
- $C_O$ = DRIVER OUTPUT CAPACITANCE ON VICTIM LINE 61d:
$$V_p \text{ LIMITED TO } \frac{V_sC_c}{C_w+C_o'+C_L}$$

FIG. 14

PEAK VOLTAGE DIVIDED BY SPICE PEAK VOLTAGE

| ROUT | Tr | _____VICTIM NET LENGTH-mm_____ | | | | | |
|---|---|---|---|---|---|---|---|
| | | 1 | 2 | 5 | 10 | 20 | 40 | 80 |
| 1000 | 800 | 1.0015 | 1.0044 | 0.9964 | 0.9870 | 0.9892 | 1.0197 | 1.0015 |
| 1000 | 200 | 1.0004 | 1.0037 | 0.9947 | 0.9879 | 1.0136 | 1.0004 | 1.0004 |
| 200 | 400 | 1.0006 | 1.0230 | 0.9946 | 0.9871 | 1.0261 | 1.0074 | 1.0006 |
| 100 | 800 | 1.0019 | 1.0270 | 1.0007 | 0.9952 | 1.0183 | 1.0354 | 1.0019 |
| 100 | 200 | 1.0003 | 1.0352 | 0.9881 | 1.0015 | 1.0302 | 1.0008 | 1.0003 |
| 25 | 200 | 1.0003 | 0.9992 | 0.9842 | 1.0155 | 1.0343 | 1.0008 | 1.0003 |

63' → $X = \dfrac{a \log(a/b)}{a-b}$, $Y = \dfrac{b \log(a/b)}{a-b}$, $K = \dfrac{abC_C V_s (R_O + R_L/2)}{b-a}$ where $a = \dfrac{2.197}{\Delta T}$, $b = \dfrac{1}{(R_O + R_L/2) C_w}$ $V_S$ = MAGNITUDE OF AGGRESSOR VOLTAGE TRANSITION $\Delta T = \dfrac{C_{C1} \Delta T_1 + C_{C2} \Delta T_2 + \cdots}{C_{C1} + C_{C2} + \cdots}$ ←— 131

62' →

$R_O$ = VICTIM NET DRIVER OUTPUT RESISTANCE
$R_L$ = VICTIM LINE RESISTANCE
$C_W$ = VICTIM LINE CAPACITANCE
$C_C = C_{C1} + C_{C2} + \cdots$ ←— 132

$$161 \rightarrow V_M = K\left[\frac{(1-e^{-X})}{X} - \frac{(1-e^{-Y})}{Y}\right] \frac{abC_C V_S (R_O + R_L/2)}{b-a}$$

163: $X = aT_{cy},\ Y = bT_{cy},\ K = \frac{1}{b-a}$ where $a = \frac{2.197}{\Delta T},\ b = \frac{1}{(R_O + R_L/2)C_W}$ 162:
$V_S$ = MAGNITUDE OF AGGRESSOR VOLTAGE TRANSITION
$\Delta T$ = TIME FOR AGGRESSOR VOLTAGE TRANSITION TO OCCUR FROM 10% $V_S$ TO 90% $V_S$
$R_O$ = VICTIM NET DRIVER OUTPUT RESISTANCE
$R_L$ = VICTIM LINE RESISTANCE
$C_W$ = VICTIM LINE CAPACITANCE
$C_C$ = COUPLING CAPACITANCE
$T_{CY}$ = TRANSITION CYCLE TIME

FIG. 18

| ROUT | ΔT | \<---- VICTIM NET LENGTH-mm ----\> | | | | | |
|---|---|---|---|---|---|---|---|
| | | 1 | 2 | 5 | 10 | 20 | 40 | 80 |
| 1000 | 800 | 0.9848 | 0.9885 | 0.9967 | 0.9748 | 0.9966 | 0.9763 | 1.0031 |
| 1000 | 200 | 0.9834 | 0.9862 | 0.9892 | 0.9678 | 0.9954 | 0.9755 | 1.0022 |
| 200 | 400 | 0.9868 | 0.9841 | 0.9863 | 0.9884 | 0.9971 | 0.9792 | 1.0239 |
| 100 | 800 | 0.9854 | 0.9879 | 0.9875 | 0.9885 | 0.9988 | 0.9886 | 1.0492 |
| 100 | 200 | 0.9857 | 0.9864 | 0.9845 | 0.9886 | 0.9968 | 0.9876 | 1.0470 |
| 25 | 200 | 0.9865 | 0.9888 | 0.9870 | 0.9900 | 0.9945 | 0.9921 | 1.1048 |

EQUATION MEAN % SPICE MEAN $$SD = asb(K)\left[S1 + S2 - S3 - (M1 - M2)^2\right]^{1/2}$$

$$M1 = \frac{1 - e^{-aT_{cy}}}{a\,T_{cy}}$$

$$M2 = \frac{1 - e^{-bT_{cy}}}{b\,T_{cy}}$$

$$S1 = \frac{1 - e^{-2aT_{cy}}}{2a\,T_{cy}}$$

$$S2 = \frac{1 - e^{-2bT_{cy}}}{2b\,T_{cy}}$$

$$S3 = 2\left[\frac{1 - e^{(-aT_{cy} - bT_{cy})}}{(a+b)\,T_{cy}}\right]$$

⎫ 164

$$SP = V_{M1} + V_{M2} + \cdots + k_1\left[(SD1)^2 + (SD2)^2 + \cdots\right]^{1/2}$$

165

IF VSP > NM, TAKE CORRECTIVE ACTION

$$b = \frac{1}{(R_o + R_L/2)C_N}$$

$C_N$ = TOTAL CAPACITANCE OF VICTIM NET $$K = \frac{abC_C V_s (R_o + R_L L_F)}{b-a}$$

$$b = \frac{1}{(R_o + R_L L_F)C_W}$$

$L_F = (L_Y - D_C)/L_Y$
$L_Y$ = LENGTH OF VICTIM LINE
$D_C$ = DISTANCE FROM A LOAD ON VICTIM LINE TO $C_C$ $$K = \frac{abC_C V_s (R_o + R_{DL}/2)}{b-a}$$

$$b = \frac{1}{(R_o + R_{DL}/2)C_W}$$

$R_{DL}$ = VICTIM LINE RESISTANCE FROM A VICTIM LINE DRIVER TO A FURTHEST LOAD

FIG. 23

$161' \rightarrow V_{MT} = K \left[ \dfrac{(1-e^{-X})}{X} - \dfrac{(1-e^{-Y})}{Y} \right] \dfrac{abC_C V_S (R_O + R_L/2)}{b-a}$ $163' \Bigg\{ X = aT_{cy}, \; Y = bT_{cy}, \; K = \dfrac{1}{(R_O + R_L/2)C_W}$ where $a = \dfrac{2.197}{\Delta T}$, $b = \dfrac{1}{(R_O + R_L/2)C_W}$ $V_S$ = MAGNITUDE OF AGGRESSOR VOLTAGE TRANSITION $162' \Bigg\{ \Delta T = \dfrac{C_{C1}\Delta T_1 + C_{C2}\Delta T_2 + \cdots}{C_{C1} + C_{C2} + \cdots}$ ← 171

$R_O$ = VICTIM NET DRIVER OUTPUT RESISTANCE
$R_L$ = VICTIM LINE RESISTANCE
$C_W$ = VICTIM LINE CAPACITANCE
$C_C = C_{C1} + C_{C2} + \cdots$ ← 172
$T_{CY}$ = TRANSITION CYCLE TIME

FIG. 24

$164a \; SD_{WA} \Rightarrow$ USE EQUATIONS 164 OF FIG.19 WITH "a", "K", BEING DEFINED AS SHOWN IN FIG.23 AND
$C_C = (C_{C1}^2 + C_{C2}^2 + \cdots)^{1/2}$ $165a \; SP' = V_{MT} + k_1 (SD_{WA})$ $166a$ IF $SP' > NM$, TAKE CORRECTIVE ACTION

FIG. 26

$V_{P*}$ = PEAK CROSSTALK VOLTAGE PER MILLIMETER OF ADJACENCY BETWEEN VICTIM AND AGGRESSOR NETS $C_{V*}$ = VICTIM LINE CAPACITANCE PER MILLIMETER $C_{C*}$ = COUPLING CAPACITANCE PER MILLIMETER OF ADJACENCY BETWEEN VICTIM AND AGGRESSOR NETS $R_{L*}$ = VICTIM LINE RESISTANCE PER MILLIMETER $R_O$ = VICTIM NET DRIVER OUTPUT RESISTANCE $L_V$ = VICTIM NET LENGTH $\Delta T$ = TIME FOR VOLTAGE TRANSITION TO OCCUR FROM 10% $V_S$ TO 90% $V_S$ $V_S$ = MAGNITUDE OF VOLTAGE TRANSITION ON AGGRESSOR NET

⎵ 182

$V_{P1} = [V_{P2*}](L_{C1})$
$V_{P2} = [V_{P2*}](L_{C2})$
ETC.

⎵ 183

$V_{PT} = V_{P1} + V_{P2} + \ldots$

⎵ 184

$$191 \begin{cases} V_{P1C} = V_{P1}(1-K_{T1}K_C) \\ V_{P2C} = V_{P2}(1-K_{T2}K_C) \\ ETC. \end{cases}$$

$$192 \quad \{ K_C = C_{in}/C_N$$

$$193 \quad \{ K_T = (1-V_{PC}/V_P) K_C$$

FIG. 27A $$201 \quad \left\{ \Delta T = \frac{C_{C1} \Delta T_1 + C_{C2} \Delta T_2 + \cdots}{C_{C1} + C_{C2} + \cdots} \right.$$

$$202 \quad \{ \text{USE ABOVE } \Delta T \text{ TO SELECT FIG. 25 TABLE}$$

$$203 \quad \{ V_{PT} = (\text{TABLE ENTRY})(LC_1 + LC_2 \cdots)$$

$$204 \quad \{ SP = K_S V_{PT}$$

FIG. 28

FIG. 27B $K_{Ti}$ = CAPACITANCE CORRECTION FACTOR $C_{W*}$ = 0.17 pF/mm; $C_{C*}$ = 0.05 pF/mm; $R_{L*}$ = 60 ohms/mm $V_S$ = 3.3 VOLTS; $\Delta T$ = 400Psec (10%-90%)

| VICTIM NET LENGTH (mm) | $R_o$ (ohms) | | | | | |
|---|---|---|---|---|---|---|
| | 100 | 200 | 400 | 800 | 1600 |
| 1 | 0.125 | 0.193 | 0.308 | 0.476 | 0.613 |
| 2 | 0.246 | 0.346 | 0.467 | 0.619 | 0.736 |
| 3 | 0.385 | 0.461 | 0.572 | 0.697 | 0.794 |
| 4 | 0.499 | 0.549 | 0.638 | 0.746 | 0.831 |
| 5 | 0.570 | 0.620 | 0.692 | 0.786 | 0.856 |
| 6 | 0.630 | 0.674 | 0.733 | 0.814 | 0.873 |
| 7 | 0.689 | 0.710 | 0.767 | 0.836 | 0.889 |
| 8 | 0.731 | 0.755 | 0.796 | 0.854 | 0.899 |
| 9 | 0.763 | 0.784 | 0.818 | 0.870 | 0.909 |
| 10 | 0.789 | 0.808 | 0.837 | 0.881 | 0.916 |
| 12 | 0.831 | 0.848 | 0.871 | 0.902 | 0.929 |
| 14 | 0.869 | 0.881 | 0.897 | 0.918 | 0.947 |
| 16 | 0.895 | 0.902 | 0.921 | 0.938 | 0.954 |
| 18 | 0.916 | 0.924 | 0.931 | 0.949 | 0.963 |
| 20 | 0.934 | 0.938 | 0.948 | 0.960 | 0.968 |
| 25 | 0.961 | 0.963 | 0.968 | 0.974 | 0.981 |
| 30 | 0.977 | 0.979 | 0.981 | 0.986 | 0.989 |
| 35 | 0.986 | 0.987 | 0.989 | 0.991 | 0.994 |
| 40 | 0.992 | 0.992 | 0.993 | 0.995 | 0.996 |

FIG. 29

$K_S$ = STATISTICAL CORRECTION FACTOR $C_V^* = 0.17$ pf/mm; $C_C^* = 0.05$ pf/mm; $R_L^* = 60$ ohms/mm
$V_S = 3.3$ VOLTS; $\Delta T = 400$Psec (10%-90%); $T_{CY} = 10$NS

| VICTIM NET LENGTH (mm) | $R_o$ (ohms) | | | |
|---|---|---|---|---|
| | 100 | 200 | 400 | 800 | 1600 |
| 1 | 0.293 | 0.297 | 0.302 | 0.308 | 0.325 |
| 2 | 0.294 | 0.301 | 0.311 | 0.326 | 0.359 |
| 3 | 0.296 | 0.306 | 0.321 | 0.345 | 0.391 |
| 4 | 0.301 | 0.313 | 0.332 | 0.363 | 0.422 |
| 5 | 0.307 | 0.320 | 0.343 | 0.381 | 0.455 |
| 6 | 0.314 | 0.329 | 0.355 | 0.400 | 0.487 |
| 7 | 0.322 | 0.338 | 0.368 | 0.419 | 0.526 |
| 8 | 0.331 | 0.349 | 0.381 | 0.439 | 0.557 |
| 9 | 0.341 | 0.360 | 0.399 | 0.460 | 0.587 |
| 10 | 0.352 | 0.372 | 0.418 | 0.481 | 0.615 |
| 12 | 0.378 | 0.399 | 0.451 | 0.516 | 0.664 |
| 14 | 0.404 | 0.430 | 0.480 | 0.572 | 0.712 |
| 16 | 0.437 | 0.465 | 0.519 | 0.615 | 0.757 |
| 18 | 0.472 | 0.503 | 0.562 | 0.660 | 0.799 |
| 20 | 0.517 | 0.543 | 0.603 | 0.702 | 0.841 |
| 25 | 0.616 | 0.650 | 0.716 | 0.802 | 0.918 |
| 30 | 0.722 | 0.753 | 0.807 | 0.889 | 0.982 |
| 35 | 0.823 | 0.846 | 0.894 | 0.959 | 1.000 |
| 40 | 0.903 | 0.925 | 0.963 | 1.000 | 1.000 |

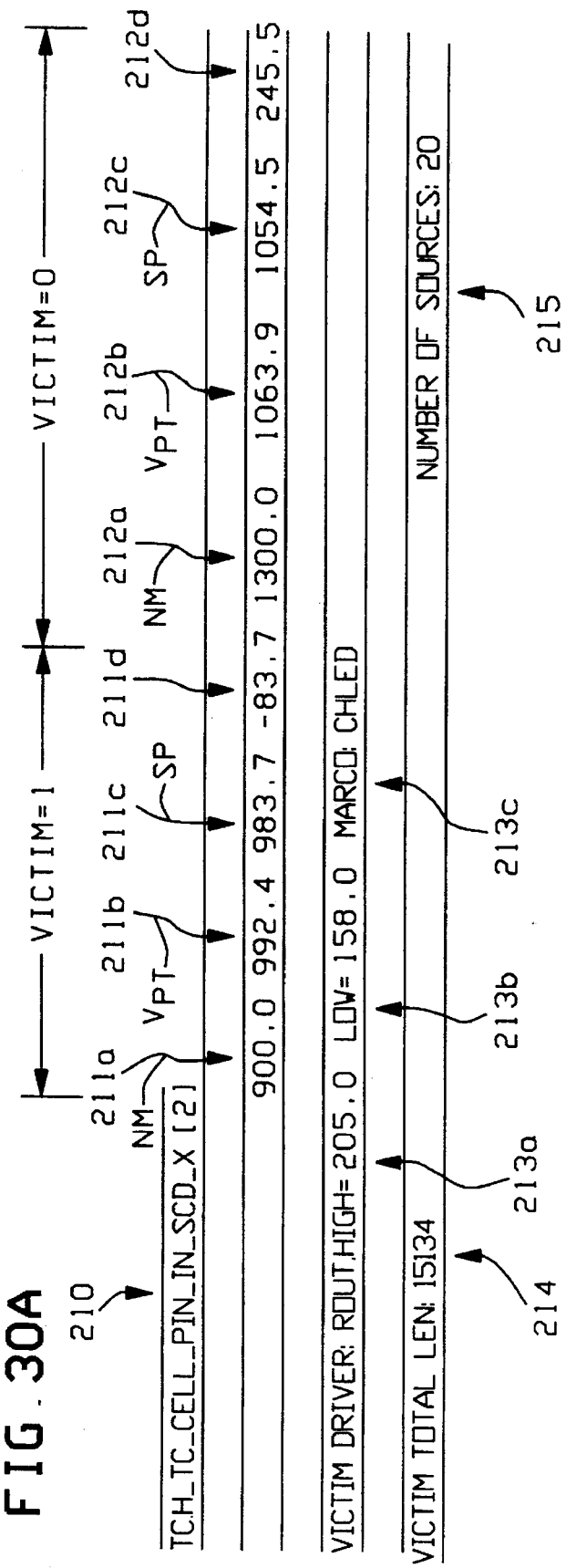
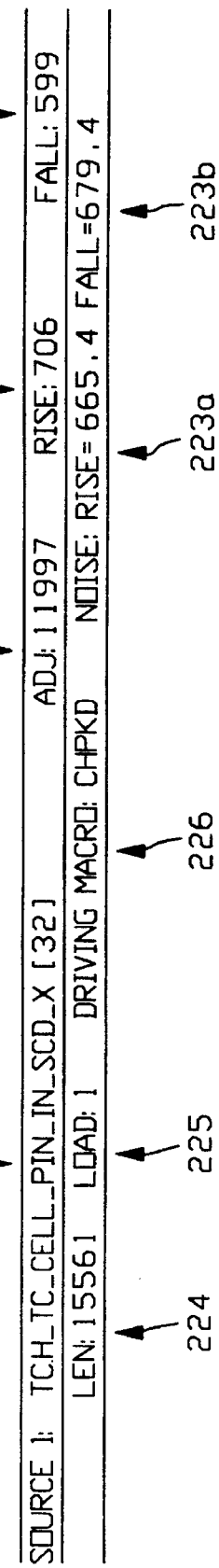
FIG. 30A
FIG. 30B

METHOD OF FABRICATING IC CHIPS WITH EQUATION ESTIMATED STATISTICAL CROSSTALK VOLTAGES BEING LESS THAN NOISE MARGIN

BACKGROUND OF THE INVENTION

This invention relates to methods for fabricating integrated circuit chips; and more particularly it relates to such methods whereby crosstalk voltages, which are coupled into a victim net on the chip by multiple adjacent aggressor nets, are within an allowable noise margin.

Conventionally, an integrated circuit chip is comprised of a thin, flat semiconductor substrate which is rectangular in shape and is about one-half inch on a side. Integrated into one surface of that substrate are a huge number of microscopic transistors; and on top of those transistors, several patterned layers of conductive material and several patterned layers of insulating material are fabricated in a stack. These insulating layers and conductive layers alternate such that any two conductive layers are separated by an insulating layer. Typically, the insulating layers are made of silicon dioxide, and the conductive layers are made of metal or doped polysilicon.

All of the conductive layers are patterned to form signal lines which interconnect the transistors, and they are also patterned to form DC voltage busses and ground busses by which power is supplied to the transistors. Some of the signal lines interconnect the transistors into multiple logic gates, such as AND gates, OR gates, NAND gates, etc.; and the remaining signal lines intercouple the logic gates to each other to thereby perform some predetermined logic function.

With present day technology, the typical number of transistors on a single chip is about one million; the typical number of logic gates which are formed by the transistors is about 150,000; and the typical number of signal lines which interconnect the logic gates is about 40,000. Each such interconnection from the output from one logic gate (the driver) to the input of one or more other logic gates (the receivers) is herein called a "net".

Ideally, the digital signals which are generated by a driver logic gate on one particular net will not affect the digital signals which are generated by any other driver logic gate on any other net. However, whenever two nets have signal line segments which lie next to each other, then a distributed parasitic capacitance will exist between them; and consequently, a voltage transition on one signal line (herein called an aggressor net) will cause a certain amount of crosstalk voltage to be coupled into the other signal line (herein called a victim net).

As long as the magnitude of the crosstalk voltage is only a small percentage of the voltage swing $V_S$ from a "0" and a "1" logic level, then the crosstalk voltage will not cause the chip to malfunction. However, if the crosstalk voltage exceeds approximately 25%–35% of the voltage swing $V_S$, then a malfunction on the chip can occur. Specifically, when a driver logic gate in a victim net is generating a "0", the total crosstalk voltage from all adjacent aggressor nets can temporarily cause that "0" to be interpreted as a "1" by a receiving logic gate. Likewise, when a driver logic gate in a victim net is generating a "1", the total crosstalk voltage from all adjacent aggressor nets can temporarily cause that "1" to be interpreted as a "0" by a receiving logic gate.

To avoid the above problem, it is desirable to be able to predict before a chip is built, the respective magnitudes of the crosstalk voltages which will be coupled into the victim nets on a chip by all of the adjacent aggressor nets. In the prior art, this could be attempted through a SPICE simulation of a proposed layout for each victim net and all of the adjacent aggressor nets. SPICE is a computer program which simulates electrical circuits; and it is available from the University of California at Berkeley, via the Department of Electrical Engineering and Computer Sciences. However, a SPICE simulation of all the nets in an entire chip is far too complex to be practical.

In order to perform a SPICE simulation of a circuit, all of the nodes between every component in the circuit need to be numbered. Then those nodes, the type of components at each node, and the component magnitudes are entered into the SPICE program.

If the circuit which is being simulated is an entire integrated circuit chip, then the number of nodes and corresponding components which need to be entered into the SPICE program is overwhelming. Firstly, the number of nets is about 40,000. Secondly, for each such net, about seventy discreet components need to be entered because in the actual chip, the net components are distributed. Specifically, each signal line has capacitance which is distributed throughout the line; and each signal line also has a resistance which is distributed throughout the line. To simulate these distributed components, each signal line needs to be represented by a ladder circuit which has about two dozen nodes; with each node having a resistor to the next node, a capacitor to ground, and a capacitor to any adjacent signal line.

After all of the nodes and corresponding components for all the nets are entered into the SPICE program, the program operates to determine the voltages which occur on each node in sequential increments of time. Typically, about 1,000 increments of ten picoseconds each are needed to obtain the entire voltage waveform on a node in one net in an integrated circuit chip. To determine the voltages for just one time increment, the SPICE program repetitively solves a matrix equation which is of the form $[Y][V]=[I]$. Here, Y is an n×n matrix, V is an n×1 matrix, and I is an n×1 matrix; where n is the number of nodes in the circuit. Thus, for a single victim net with twenty aggressor nets, n is (24 nodes per net)×(21 nets) or 504.

For each increment in time, the SPICE program makes about five iterations before it converges on a solution. This iterative process is repeated for each of the subsequent time increments.

Using a state of the art workstation, it takes about ten minutes to perform a SPICE simulation of a single circuit which has 500 nodes and for which a solution is sought for 1,000 time increments. Such a circuit represents a typical victim net with twenty aggressor nets. Consequently, to simulate a chip which has 40,000 nets would take about 400,000 minutes, or more than 270 days to complete!

Accordingly, a primary object of the present invention is to provide a method of fabricating integrated circuit chips by which the above problems are overcome.

BRIEF SUMMARY OF THE INVENTION

In one method according to the present invention, an integrated circuit chip is fabricated by the following steps:

1) providing a trial layout in the chip for a victim net and a set of aggressor nets which have segments that lie next to the victim net;

2) assigning to the trial layout of the victim net, the parameters of—a line capacitance, a line resistance, and a driver output resistance; and assigning to the trial layout of each aggressor net, the parameters of—a coupling capacitance to the victim net, a voltage transition, and a transition cycle time;

3) estimating, for each aggressor net, a respective mean crosstalk voltage $V_M$ which the aggressor $$V_M = K \left[ \frac{(1-e^x)}{x} - \frac{(1-e^y)}{y} \right]$$

where K, X, and Y are products of the assigned parameters;

4) modifying the trial layout and repeating the assigning and estimating steps until a summation of the estimated mean crosstalk voltages in the victim net is within an acceptable level; and, 5) building the chip with the modified layout for which the summation is within the acceptable level.

In another method according to the present invention, the integrated circuit chip is fabricated by the same above steps 1, 2 and 5; but steps 3 and 4 are performed as:

3) estimating, a total mean crosstalk voltage $V_{MT}$ which all of the aggressor nets together couple into the victim net as a functio $$V_{MT} = K \left[ \frac{(1-e^x)}{x} - \frac{(1-e^y)}{y} \right]$$

where K, X, and Y are products of the parameters and a weighted average of the voltage transistions on the aggressor nets;

4) modifying the trial layout and repeating the assigning and estimating steps until the estimated total peak crosstalk voltage in the victim net is within an acceptable level.

Several preferred ways to form the products K, X, and Y of step 3 are disclosed in the Detailed Description; and an example of one particular way is as follows:

$$X = aT_{cy}, \quad Y = bT_{cy}, \quad K = \frac{abC_cV_s(R_o + R_L/2)}{b-a},$$

$$\text{where} \quad a = \frac{2.197}{\Delta T},$$

$$b = \frac{1}{(R_o + R_L/2)C_w},$$

$V_s$=magnitude of the voltage transition,
$\Delta T$=time for the voltage transition to occur from 10% $V_S$ to 90% $V_S$,
$R_o$=the victim net driver output resistance,
$R_L$=the victim line resistance,
$C_w$=the victim line capacitance,
$C_c$=the coupling capacitance, and,
$T_{cy}$=the transition cycle time.

Several preferred ways to modify the chip layout per step 4, and thereby reduce crosstalk voltage to an acceptable level, are disclosed in the Detailed Description; and these layout changes include the following:

a) moving an aggressor net such that a segment of a signal line which lies next to the victim net is shortened;

b) changing a driver circuit in the victim net such that driver output resistance is reduced;

c) inserting a buffer circuit into the victim net;

d) adding capacitance to a victim signal line and/or an aggressor signal line; and e) moving the victim signal line from one input on a load circuit to another input which has a larger noise margin.

An important feature of the above methods is the speed at which the crosstalk voltages $V_M$ and $V_{MT}$ are estimated in comparison to the time which it takes to set up and run a SPICE simulation of the actual victim net and its adjacent aggressor nets. When the estimations were made by the present inventor on a 66 MHz 486 DX2 personal computer, the respective mean crosstalk voltages on 10,000 different victim nets which each had a dozen aggressor nets was estimated in less than one minute

BRIEF DESCRIPTION OF THE DRAWINGS

Several preferred methods of fabricating integrated circuit chips, in accordance with the present invention, are described herein in conjunction with the accompanying drawings wherein:

FIG. 5A shows how yet another parameter $\Delta T$, which is the transition time of a voltage change on the aggressor net, affects the magnitude of the crosstalk voltage that an aggressor net couples into a victim net;

FIG. 5B shows how the transition times $\Delta T$ can be estimated;

FIG. 6 shows a first base method according to the present invention, by which the peak crosstalk voltage which an aggressor net couples into a victim net is estimated as products of the parameters which are illustrated in FIGS. 2A through 5B;

FIG. 7 provides a table which compares the accuracy of the peak crosstalk voltage, as estimated by the FIG. 6 method, with the peak crosstalk voltage as obtained from SPICE simulations;

FIG. 11 shows a modification to the FIG. 6 method of estimating crosstalk voltage, by which load input capacitance on the victim net is accounted for;

FIG. 12 shows another modification to the FIG. 6 process of estimating crosstalk voltage, that accounts for the location in the victim net at which the coupling from an aggressor net occurs;

FIG. 14 provides yet another modification to FIG. 6 process of estimating crosstalk voltage, by which empirical corrections are employed to make the estimated crosstalk voltage more accurate;

FIG. 15 provides the table which compares the estimated peak crosstalk voltage as determined by the FIG. 14 method, with the peak crosstalk voltage as determined by SPICE simulations;

FIG. 16 shows a second base method of estimating peak crosstalk voltage in a victim net, which is an alternative to the first base method of FIG. 6 and which employs a weighted average transition time;

FIG. 17 shows a third base method of estimating crosstalk voltage in a victim net, which is an alternative to the base methods of FIGS. 6 and 16, and which estimates a mean crosstalk voltage rather than a peak crosstalk voltage;

FIG. 18 provides a table which compares the mean crosstalk voltage as estimated by the FIG. 17 method, with the mean crosstalk voltages as determined from SPICE simulations;

FIG. 19 shows an addendum to the FIG. 17 method by which a statistical peak crosstalk voltage is estimated as the sum of the mean and a multiple of the standard deviations from that mean;

FIG. 20 shows a modification to the methods of FIGS. 17 and 19, by which input capacitance on the victim net is accounted for;

FIG. 23 shows a fourth base process, which is an alternative to the base process of FIG. 17, whereby the mean crosstalk voltage on all of the aggressor nets together is estimated by employing a weighted average transition time;

FIG. 24 shows an addendum to the FIG. 23 method by which the standard deviation and statistical peak crosstalk voltage are estimated;

FIG. 26 further explains how the FIG. 25 table is used to estimate the total peak crosstalk voltage which is coupled into a victim net by all adjacent aggressor nets;

FIG. 27A is a modification to the base process of FIG. 25, by which load input capacitance on the victim net is accounted for;

FIG. 27B provides a table which is used in conjunction with the modified process of FIG. 27A;

FIG. 28 shows a sixth base process, which is an alternative to the base process of FIG. 26, whereby the total peak crosstalk voltage which is coupled into a victim net is estimated by employing a weighted average transition time and the FIG. 25 table;

FIG. 29 provides a table which may be used in conjunction with the process of FIG. 28 to estimate the statistical peak crosstalk voltage which is coupled into a victim net;

FIG. 30A shows a portion of a printout from a computer program which estimates the crosstalk voltages which are coupled into a victim net via the methods of FIGS. 6 and 19; and, FIG. 30B shows another portion of the same printout which illustrates how one particular aggressor net contributes to the total crosstalk voltage which is coupled into the victim net of FIG. 30A.

DETAILED DESCRIPTION

Figure 1:
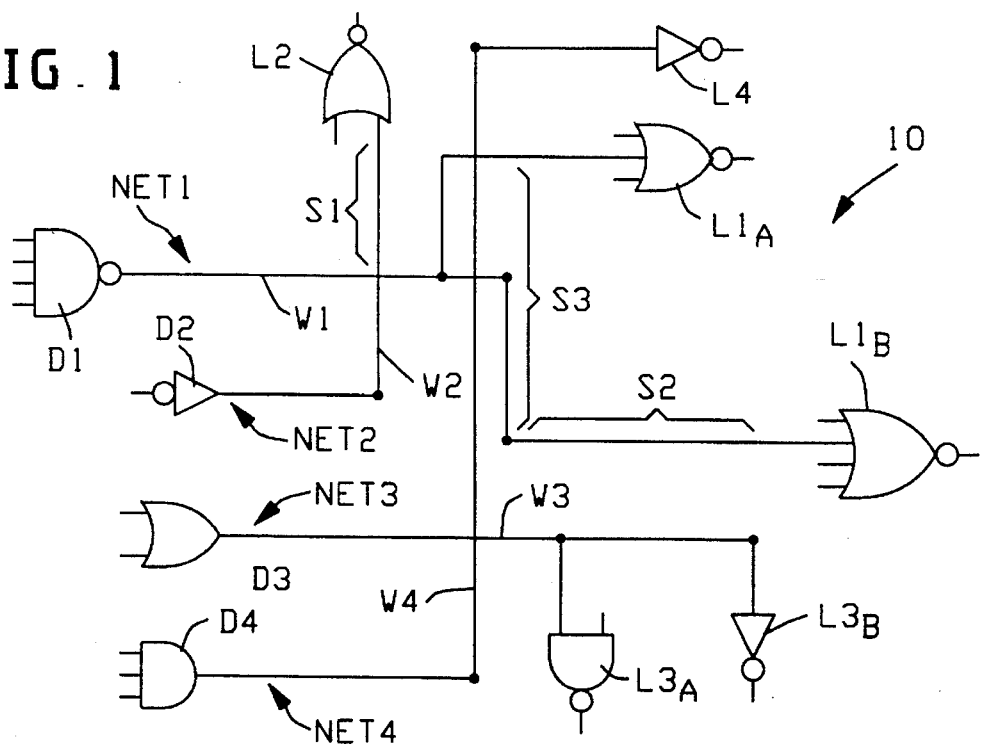
FIG. 1 is a circuit diagram of a portion of an integrated circuit chip, that contains a victim net and several aggressor nets with which the present invention is concerned.

Referring now to FIG. 1, it shows a portion 10 of an integrated circuit chip to which the present invention is herein applied. In the chip portion 10, there are four nets which are labeled NET1, NET2, NET3, and NET4.

Included in NET1 is a signal line W1, a driver circuit D1, and two load circuits $L1_A$ and $L1_B$. Driver circuit D1 is a four input NAND gate; load circuit $L1_A$ is a three input NOR gate; and load circuit $L1_B$ is a four input NOR gate.

Net2 includes a signal line W2, a driver circuit D2, and load circuit L2. Driver circuit D2 is an inverter gate; and load circuit L2 is a two input NOR gate.

Net3 includes a signal line W3, a driver circuit D3, and two load circuits $L3_A$ and $L3_B$. Driver circuit D3 is a two input OR gate; load circuit $L3_A$ is a two input NAND gate; and load circuit $L3_B$ is an inverter gate.

Net4 includes a signal line W4, a driver circuit D4, and a load circuit L4. Driver circuit D4 is a three input AND gate; and load circuit L4 is an inverter gate.

In the chip portion 10, each of the driver circuits D1, D2, D3, and D4 and each of the load circuits $L1_A$, $L1_B$, $L2$, $L3_A$, $L3_B$, and $L_4$ are fabricated at respective locations as shown in FIG. 1 on a semiconductor substrate. Then, to interconnect those driver circuits and load circuits, the signal lines W1–W4 are routed as shown; and they are structured out of first and second patterned layers of metal which lie above the semiconductor substrate.

In FIG. 1, each portion of a signal line which is structured from the first layer metal is drawn in a horizontal direction; whereas each portion of a signal line which is structured from the second layer metal is drawn in the vertical direction. Interconnections between these two metal layers are made by respective via contacts through an insulating layer which lies between the metal layers. These via contacts are shown in FIG. 1 as small solid dots on the lines W1–W4.

In operation, the driver circuits D1–D4 generate respective digital signals on the lines W1–W4 to which they are connected. Ideally, the digital signals which are generated by the driver circuits on any one particular signal line do not affect the signals which are generated by any other driver on any other signal line. However, wherever two of the signal lines W1–W4 have segments which lie next to each other in the same metal layer, a distributed coupling capacitance will exist between them; and, due to that coupling capacitance, a voltage transition on one signal line will cause a certain amount of crosstalk voltage to be induced in the other signal line.

Inspection of FIG. 1 shows that the signal line W1 has three segments which run next to corresponding segments of the other signal lines W2, W3, and W4. Specifically, segment S1 of the signal lines W1 and W2 run next to each other; segment S2 of the signal lines W1 and W3 run next to each other; and segment S3 of the signal lines W1 and W4 run next to each other. To reflect this net layout, NET1 is said to be a "victim net" that is coupled to three "aggressor nets" which are NET2, NET3, and NET4.

When the digital signal from the driver circuit on an aggressor net switches from a "1" to a "0" (or vice-versa), the magnitude of the crosstalk voltage which is coupled into the signal line of the victim net is dependent upon several circuit parameters. Two of these parameters, which have a major impact on the magnitude of the crosstalk voltage, are $C_C$ and $C_W$; and they are illustrated in detail on FIGS. 2A and 2B.

Parameter $C_C$ is the coupling capacitance between the signal line of a victim net and the signal line of an aggressor net; whereas parameter $C_W$ is the total capacitance of the signal line in the victim net. This total signal line capacitance $C_W$ is made up of the coupling capacitance $C_C$ plus another capacitance $C_S$ which exists between the signal line and any other adjacent circuit structures which are at a constant voltage potential. Capacitance $C_S$ includes the capacitance of the signal line to—a) the underlying semiconductor substrate, b) any overlying/underlying DC supply voltage conductor or ground conductor, and c) any adjacent signal lines which are not switching.

Figure 2A:
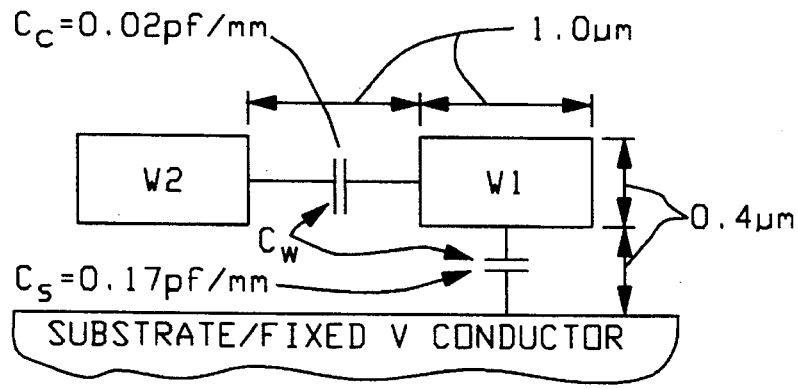
FIG. 2A shows two parameters $C_C$ and $C_W$, for a 1.0 micron integrated circuit technology, which have a major impact on the magnitude of the crosstalk voltage that an aggressor net couples into a victim net.

In FIG. 2A, the parameters $C_C$ and $C_W$ are illustrated for one particular integrated circuit technology wherein the signal lines have a width of 1.0 µm, a spacing of 1.0 µm, and a height of 0.4 µm. By comparison, in FIG. 2B, the parameters $C_C$ and $C_W$ are illustrated for a more advanced integrated circuit technology wherein the signal lines have a width of 0.5 µm, a spacing of 0.5 µm, and a height of 0.4 µm.

Figure 2B:
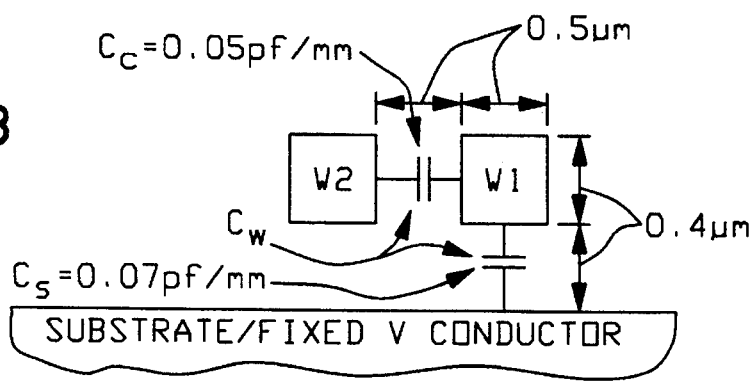
FIG. 2B shows the same two parameters $C_C$ and $C_W$, for a 1.0 as illustrated in FIG. 2A, except that the FIG. 2B parameters are for a 0.5 micron technology.

For any integrated circuit technology, the magnitude of the coupling capacitor $C_C$ increases as the signal line height increases, and as the spacing between adjacent signal lines decreases. Inspection of FIGS. 2A and 2B shows that as an integrated circuit technology advances, the spacing between signal lines is reduced while the height of the signal lines remains essentially unchanged. Consequently, in the advanced integrated circuit technology of FIG. 2B, the coupling capacitance $C_C$ is increased over the coupling capacitance in FIG. 2A.

By comparison, capacitance $C_S$ increases as the width of the signal line increases, and as the distance between the signal line and the substrate decreases, and as the distance between the signal line and overlying/underlying DC supply voltage conductor decreases. Inspection of FIGS. 2A and 2B shows that when an integrated circuit technology is scaled down in size, the width of a signal line gets decreased while the spacing of a signal line to the substrate and overlying/underlying conductors stays essentially unchanged. Thus, as an integrated circuit technology is scaled down in size, the capacitance $C_S$ gets decreased.

The above-described manner in which the capacitances $C_C$ and $C_W$ vary is important because the peak crosstalk voltage which is induced into the signal line of a victim net increases as the ratio $CC/C_W$ increases. This ratio of $CC/C_W$ increases rapidly as the signal line width and signal line spacing is reduced because the parameter $C_C$ is increasing while the parameter $C_W$ is decreasing. Thus, as integrated circuit technology is scaled down in size, the magnitudes of the peak crosstalk voltages which are induced into the victim nets increase rapidly.

Figure 3A:
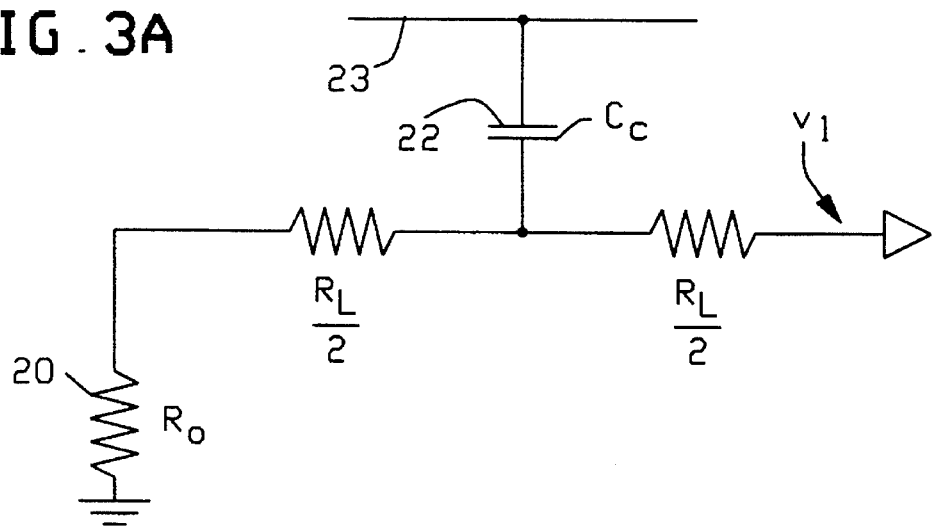
FIG. 3A shows two additional parameters $R_L$ and $R_e$ which have a major effect on the magnitude of the crosstalk voltage that an aggressor net couples into a victim net.
Figure 3B:
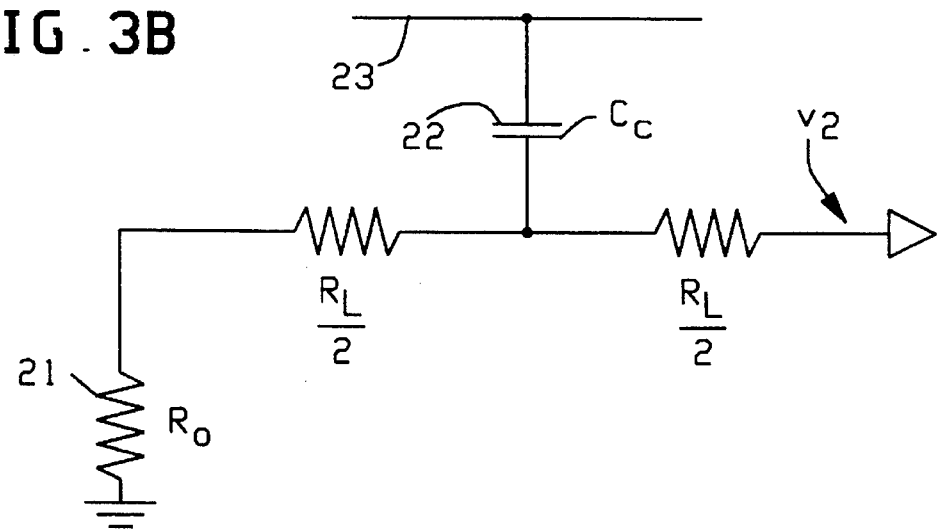
FIG. 3B shows the same two parameters $R_L$ and $R_o$ as illustrated in FIG. 3A, except that the FIG. 3B parameters have different relative magnitudes.
Figure 3C:
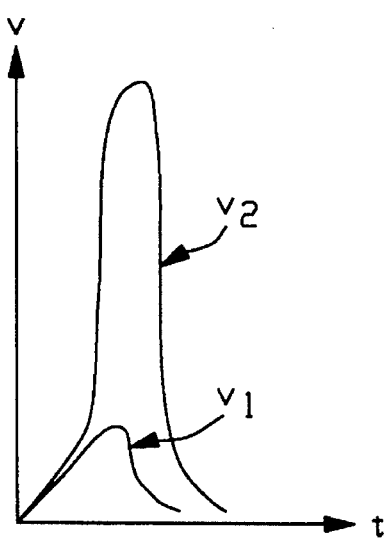
FIG. 3C shows the crosstalk voltages which are coupled into the victim net by the parameters $R_L$ and $R_o$ of FIGS. 3A and 3B.

Turning now to FIGS. 3A–3C, two additional parameters which affect the magnitude of the crosstalk voltage that is induced into the signal line of the victim net will be described. One of these parameters is the output resistance $R_O$ of the driver circuit of the victim net; and the other parameter is the resistance $R_L$ of the signal line in the victim net.

In FIG. 3A, the output resistance $R_O$ of the victim net driver circuit is shown as a small resistor 20; whereas in FIG. 3B, the output resistance $R_O$ is shown as a large resistor 21. Whether the output resistance of an actual driver circuit is large or small will depend upon the particular internal circuit structure of that driver circuit.

Also in FIGS. 3A and 3B, a coupling capacitor 22 is shown between the signal line 23 of an aggressor net and the signal line 24 of the victim net. To simplify the drawing, the coupling capacitor is shown to be lumped at the center of the signal line of victim net with one-half of the signal line resistance on either side of the coupling capacitor.

In the circuits of FIGS. 3A and 3B, a "0" to "1" voltage transition on the signal line 23 will cause a current pulse to be injected through the coupling capacitor into the victim net signal line 24; and that current pulse will travel down the victim net signal line and get discharged through the driver output resistance $R_O$. Consequently, the crosstalk voltage in the victim net signal line 24 will increase in magnitude as the resistance through which the current pulse passes increases.

In FIG. 3C, the voltage waveform 25*a* shows the small crosstalk voltage pulse which is induced in the victim net signal line of FIG. 3A due to the small driver output resistance 20. By comparison, the voltage waveform 25*b* shows the large crosstalk voltage which is induced in the victim net signal line of FIG. 3B due to the large driver output resistor 21.

Note that for any one particular victim net, the driver output resistance $R_O$ will generally have two different values. One value of $R_O$ occurs when the driver is generating a "0", and the other value of $R_O$ occurs when the driver is generating a "1".

Another parameter which affects both the peak magnitude and the shape of the crosstalk voltage that is induced in the victim net signal line is the overall length of the signal line. This is illustrated in FIG. 4 wherein crosstalk voltage plots 31–35 are provided for five victim nets of different lengths.

Figure 4:
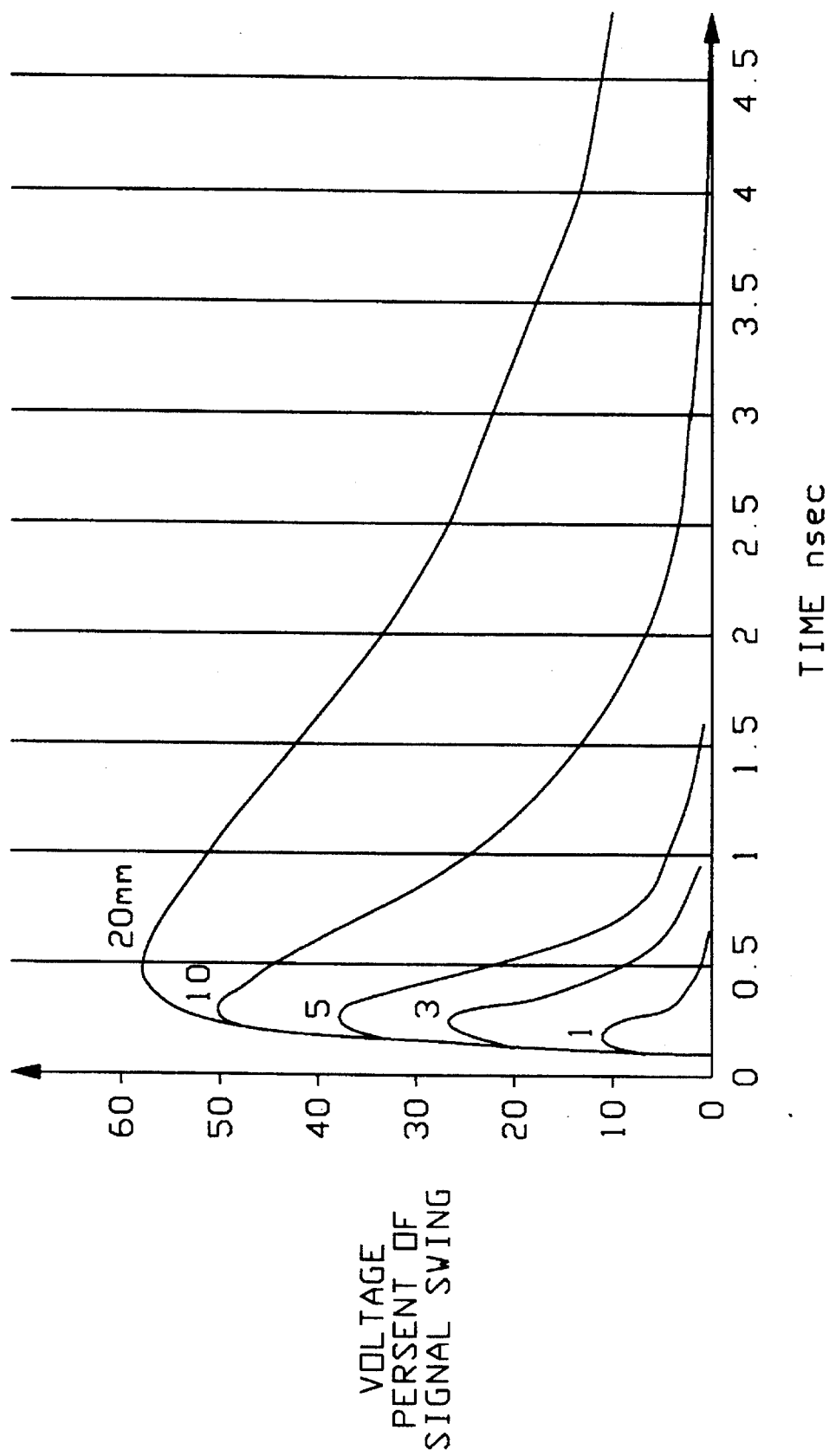
FIG. 4 shows how still another parameter, victim net length $V_L$, affects the magnitude of the crosstalk voltage that an aggressor net couples into a victim net.

In FIG. 4, the victim net lengths for the plots 31–35 respectively are 1 mm, 3 mm, 5 mm, 10 mm, and 20 mm. Inspection of FIG. 4 shows that as the length of the victim net increases, the magnitude of peak crosstalk voltage also increases but at a decreasing rate. For example, an increase in the victim net length from 1 mm to 3 mm causes an increase rise in the peak crosstalk voltage of 150%; whereas an increase in the victim net length from 10 mm to 20 mm causes an increase in the peak crosstalk voltage of only about 15%.

Inspection of FIG. 4 further shows that as the length of the victim net increases, the time duration of the induced crosstalk voltage pulse also increases. This increase in time duration occurs because any increase in the length of the victim net signal line is accompanied by an increase in the line capacitance $C_W$. In turn, this increase in the line capacitance $C_W$ causes an increase in the time that it takes for the victim net signal line to discharge.

Still another parameter which affects the magnitude of the crosstalk voltage that is induced in the victim net is the speed at which a voltage transition occurs on an adjacent aggressor net. This is illustrated in FIG. 5A by a table which has two rows 41 and 42 and seven columns 43–49.

Each row in FIG. 5A corresponds to a particular victim net length, and each column corresponds to a particular transition time ΔT of a voltage change on an adjacent aggressor net. This transition time ΔT is given in picoseconds; and it is the time which it takes for the voltage on the aggressor net to change from 10% of its full swing $V_S$ to 90% of that full swing $V_S$.

Each entry at a particular row and a particular column in the table of FIG. 5A gives the peak crosstalk voltage which is induced in the victim net. For example, the entry at row 41—column 43 indicates that a crosstalk voltage of 180 mV is induced in a victim net of 1 mm when the transition time on the aggressor net is 200 picoseconds. By comparison, the entry at row 41—column 49 indicates that a peak crosstalk voltage of only 36 mV is induced in the victim net of 1 mm when the transition time on the aggressor net is slowed down to 2,000 picoseconds.

One method of estimating the transition time of "0" to "1" or "1" to "0" voltage change on an aggressor net is illustrated in FIG. 5B by the equations 51a and 51b, 52a and 52b, 53a and 53b, and 54a and 54b. Equations 51a and 51b respectively give the transition time of a "0" to "1" voltage change and a "1" to "0" voltage change on an aggressor net which is driven by a 4 x inverter circuit. By a 4 x inverter circuit is herein meant an inverter in which the transistor sizes are four times larger than some predetermined nominal size.

Each of the equations 51a and 51b includes three terms T1, T2 and T3. Term T1 is a base transition time which is a fixed number of picoseconds. Term T2 is a capacitance correction factor which must be multiplied by the total capacitance (in picofarads) that is driven by the driver circuit on the aggressor net. Term T3 is a driver input correction factor which must to be multiplied by the transition time of the signal voltage on the input of the driver circuit in the aggressor net.

For example, suppose an aggressor net which is driven by a 4 x inverter circuit has a total net capacitance of 5 picofarads and suppose that the rise and fall time of the signal to the input of the aggressor net driver circuit is 5 nanoseconds. In that case, the transition time in picoseconds of a "0" to "1" voltage change on the aggressor net will be 110+1100×5+203×5; and the transition time in picoseconds of a "1" to "0" voltage change on the aggressor net will be 71+1185×5+193×5.

Likewise, equations 52a and 52b respectively give the rise and fall transition times on an aggressor net which is driven by an 8x inverter circuit. Equations 53a and 53b give the rise and fall transition times of a voltage change on an aggressor net which is driven by a 4x NAND circuit. And, equations 54a and 54b give the rise and fall transition times of a voltage change on an aggressor net which is driven by a 4 x NOR circuit. Each of these equations include the three above-described terms T1, T2, and T3.

Now, in accordance with the present invention, the peak crosstalk voltage which is induced in a victim net by a voltage transition on an aggressor net is estimated by a closed form equation 61 as shown in FIG. 6. To evaluate this equation, a particular victim net on an integrated circuit chip is selected along with a particular aggressor net which has a segment that lies adjacent to the victim net. Then, based on the layout in the chip of the victim net and the aggressor nets, numerical values are assigned to each of the previously described parameters of $C_W$, $C_C$, $R_O$, $R_L$, $V_S$, and $\Delta T$. These parameters are restated in FIG. 6 by a set of equations 62. Then, several products X, Y, K, a and b of the parameters are formed as given by a set of equations 63 in FIG. 6. There, and hereinafter, "Log" means to the base "e". Substituting those products into equation 61 yields an estimation of the peak crosstalk voltage which is coupled into the victim net.

Each aggressor net will typically have a different voltage transition time $\Delta T$ then all of the other aggressor nets. Thus, for each aggressor net, the equations 61–63 need to be evaluated one time. Then, to obtain an estimate of the total peak crosstalk voltage which is induced into the victim net, the respective peak crosstalk voltages which are estimated by equation 61 for each aggressor net are added together.

One important feature of the FIG. 6 equations is the speed at which they can be evaluated in comparison to the time which it takes to set up and run a SPICE simulation of the actual victim net and its corresponding aggressor nets. When the FIG. 6 equations were evaluated by the present inventor on a 66 MHz 486 DX2 personal computer, the respective peak crosstalk voltages on 10,000 different victim nets which each had a dozen aggressor nets was estimated in less than one minute. By comparison, to set up and run SPICE simulations of those same nets is a task which would take several man years to complete. Further, even if the set up of the SPICE simulations were some how automated, just running the SPICE simulations would take hundreds of hours of computer time. In addition, that time would increase in proportion to the number of victim nets on the chip, and present day chips have over 100,000 nets.

Another important feature of the FIG. 6 equations is the accuracy with which the peak crosstalk voltage $V_p$ is estimated. To measure this accuracy, the present inventor ran SPICE simulations on dozens of typical victim nets with corresponding aggressor nets; and the peak crosstalk voltage which was obtained by those simulations was compared with the peak crosstalk voltage which is obtained via the equations 61–63 in FIG. 7. Results of this comparison are given in FIG. 7; and they show that the peak crosstalk voltage as estimated by the equations 61–63 is usually within ±10% of the peak crosstalk voltage as given by the SPICE simulations.

After the total peak crosstalk voltage which all the aggressor nets together induce into the victim net is obtained via the FIG. 6 equations, that peak crosstalk voltage is compared to a noise margin which is available for crosstalk in the victim net. If that noise margin is exceeded, then the layout of the victim net and/or an aggressor net is modified such that the available noise margin is not exceeded. This step will now be described in greater detail in conjunction with FIGS. 8, 9, 10a and 10b.

Figures 8, 9:
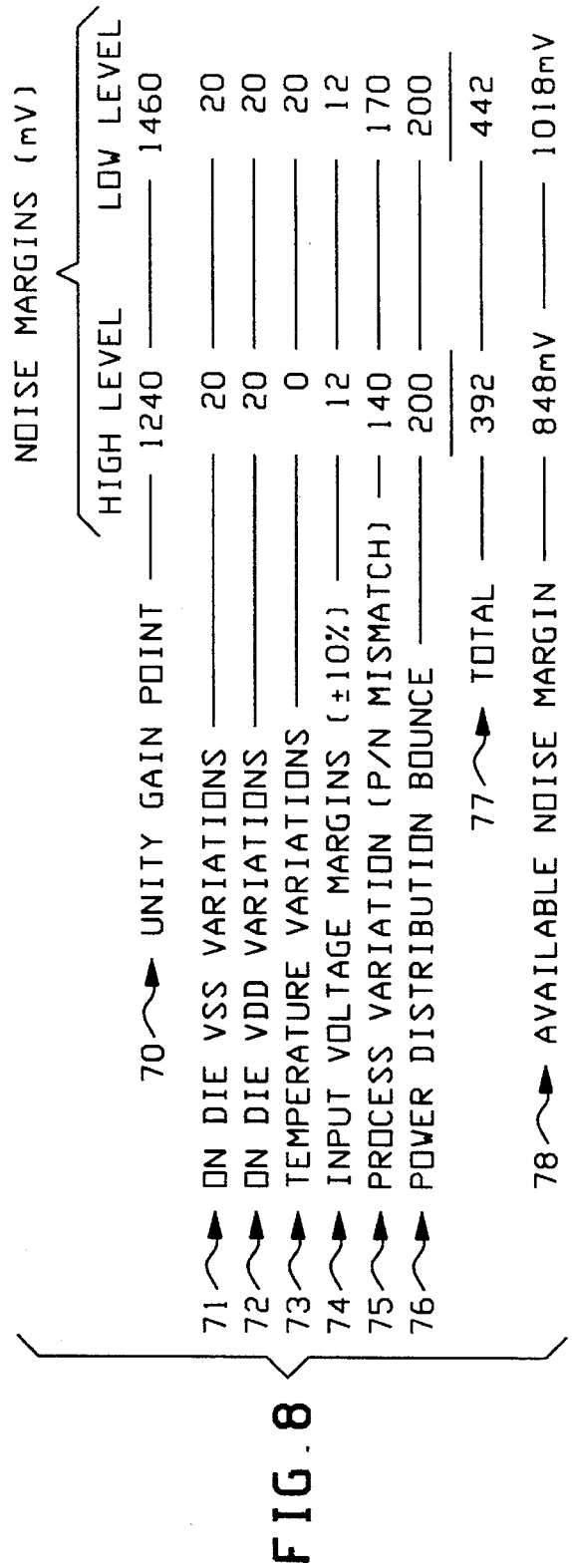
FIG. 8 lists various factors that determine the noise margin which is available in a victim net and which must not be exceeded by the crosstalk voltage which is coupled into the victim net by all adjacent aggressor nets.
FIG. 9 provides a set of corrective steps which can be taken to alter the layout of an integrated circuit chip such that the crosstalk voltage in a victim net is reduced below the available noise margin.

Beginning with FIG. 8, it shows that for each load circuit in the victim net, there is one noise margin for the high voltage level and another noise margin for the low voltage level. The high level noise margin is the amount by which a "1" voltage level can be reduced before the unity gain point is reached on the output of the load circuit which receives the reduced "1" signal. Similarly, the low level noise margin is the amount by which the "0" voltage level can be increased before the unity gain point is reached on the output signal from the load which receives the increased "0" signal.

FIG. 8 gives an example 70 for a typical inverter circuit wherein the high level noise margin is 1240 mV, and the low level noise margin is 1460 mV. Actual high level and low level noise margins will vary from one integrated circuit technology to another; but the noise margins 70 of FIG. 8 are representative of a present day CMOS integrated circuit technology wherein the voltage swing $V_S$ is 3.3 volts.

In an integrated circuit chip, only a portion of the high level noise margin and a portion of the low level noise margin is available to accommodate crosstalk voltage which is coupled into a victim net by adjacent aggressor nets. That is because, as FIG. 8 shows, several other items 71–76 also encroach upon the total available noise margin. When the portion of the noise margin which is allocated to items 71–76 is subtracted from the high level and low level noise margins 70, the resulting difference 78 is the maximum amount of noise which may be coupled as crosstalk voltage into a victim net.

Item 71 accounts for tolerances on the integrated circuit chip in a DC supply voltage $V_{SS}$ for the "0" voltage level. Similarly, item 72 accounts for tolerances on the integrated circuit chip in a DC supply voltage $V_{DD}$ for the "1" voltage level. Item 73 accounts for temperature variations which the integrated circuit chip may encounter during its operation. Item 74 accounts for variations in the voltage level of the "1" and "0" signal levels which are generated on the signal lines in the chip. Item 75 accounts for process variations which occur when the P-type transistors and N-type transistors in the chip are being fabricated. And, item 76 accounts for transient voltage spikes which may occur in the supply voltages $V_{SS}$ and $V_{DD}$ when the driver circuits switch their output signals from "1" TO "0" and vice-versa.

Due to the above items 71–76, the amount of crosstalk voltage which can be tolerated on the high voltage level of a victim net is reduced from 1240 mV to only 848 mV. Also, the amount of crosstalk voltage which can be tolerated on the low voltage level of a victim net is reduced from 1460 mV to only 1018 mV. To determine if these available noise margins are exceeded, the equations of FIG. 6 need to be applied two different ways.

In one application, $\Delta T$ in equation 62 is selected for a "0" to a "1" transition on the aggressor nets. Such a transition will couple crosstalk voltage into the victim net which adds to a "0", so $R_O$ is selected for a "0" driver output. Then, the crosstalk voltage is compared to the low level noise margin which is available on the victim net as given by item 78.

In the second application, $\Delta T$ in equation 62 is selected for a "1" to "0" transition on the aggressor nets. Such a transition will couple crosstalk voltage into the victim net which subtracts from a "1", so $R_O$ is selected for a "1" driver output. Then, the crosstalk voltage is compared to the high level noise margin which is available in the victim net as given by item 78.

If the noise margin which is available on either the high level or the low level is exceeded by the above estimated crosstalk voltage, then corrective action needs to be taken in the layout of the integrated circuit chip. Preferably, such corrective action includes, performing one or more of the steps 81–85 which are listed in FIG. 9.

With step 81, an aggressor net is moved such that a segment of a signal line which lies next to the victim net is shortened. For example, in FIG. 1, the vertical segment S1 of the signal line W2 could be moved to the left such that it is not adjacent to the victim net. Likewise, the horizontal segment S2 of the signal line W3 could be moved downward such that it is not adjacent to the victim net.

With step 82 in FIG. 9, the driver circuit in the victim net is changed such that the driver output resistance is reduced. For example, in FIG. 1, the driver circuit D1 in the victim net is changed such that the driver output resistance is reduced. This may be achieved by simply increasing the size of the transistors in the driver circuit D1, or by replacing the driver circuit D1 with a different type of logic gate which has a reduced output resistance.

With step 83 of FIG. 9, a buffer circuit is inserted into the victim net. This buffer circuit can be a single noninverting logic gate, such as a one input AND gate; or it can be two inverting gates in series. In the example of FIG. 1, the buffer circuit could be inserted into the victim net signal line W1 near the connection between the segments S2 and S3. In that case, the crosstalk voltage which is coupled into segment S2 of signal line W1 would not be added to the crosstalk voltage which is coupled into segment S3.

With step 84 in FIG. 9, capacitance is added to either a victim signal line or an aggressor signal line. By adding capacitance to an aggressor signal line, the transition time of $\Delta T$ on the aggressor signal will be increased; and that will result in a lowering of the induced crosstalk voltage as was described in conjunction with FIG. 5a. By comparison, adding capacitance to the victim signal line decreases the ratio of CO/CS; and that in turn reduces the magnitude of the crosstalk voltage as was described in conjunction with FIGS. 2a and 2b.

With step 85 of FIG. 9, the victim signal line is moved from one input on a load circuit to another input which has a larger noise margin. This alternative is illustrated in further detail in FIGS. 10A and 10B below.

Figure 10A:
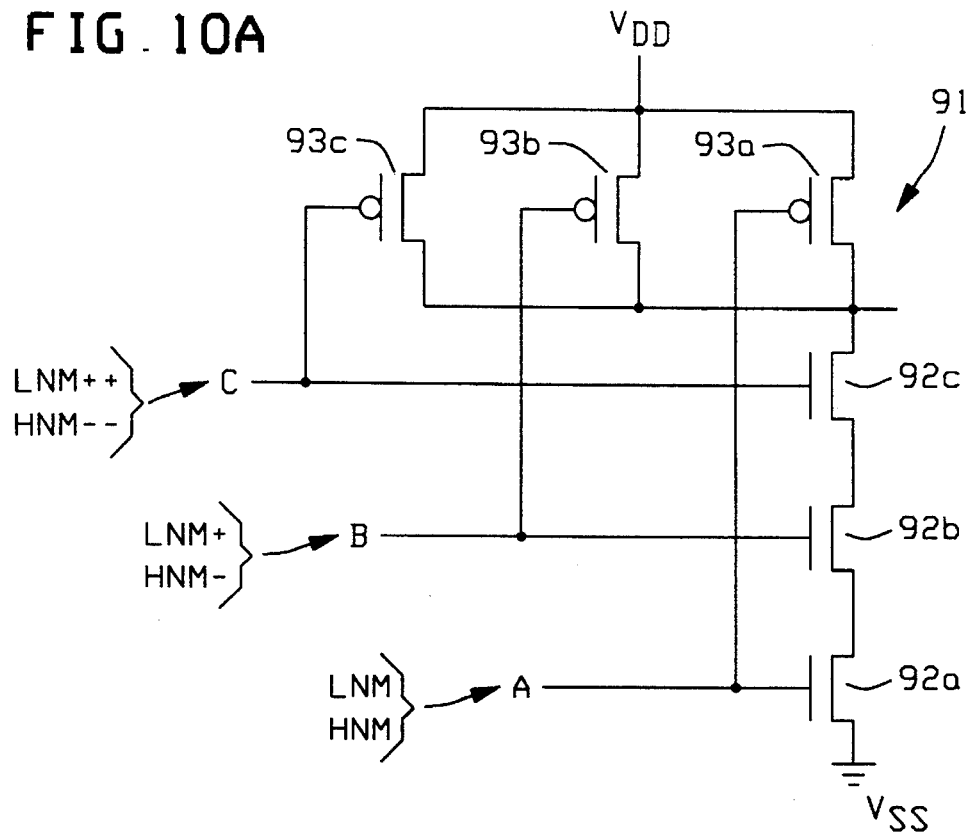
FIGS. 10A and 10B are circuit diagrams which further explain one of the steps in FIG. 9.

In FIG. 10A, reference numeral 91 identifies a NAND gate which has three inputs A, B, and C. In this NAND gate, there are three N-channel transistors 92a–92c which are connected in series and three P-channel transistors 93a–93c which are connected in parallel.

Each of the N-channel transistors, by themselves, have the same threshold voltage level at which they turn-on. However, due to the series connection between those N-channel transistors in the NAND gate 91, those transistors have different thresholds. Specifically, transistor 92a has the normal threshold voltage level; transistor 92b has a threshold which is shifted above the threshold of transistor 92a; and transistor 92c has a threshold which is shifted above the threshold of transistor 92b.

Due to the above threshold shifts, input "B" has a bigger low-level noise margin LNM+ than input "A"; and input "C" has a bigger low-level noise margin LNM++ than input "B". However, the reverse is true for the high-level noise margin HNM. That is, input "A" has the normal high-level noise margin HNM; input "B" has a smaller high-level noise margin HNM- than input "A"; and input "C" has a smaller-level noise margin HNM- than input "B".

Figure 10B:
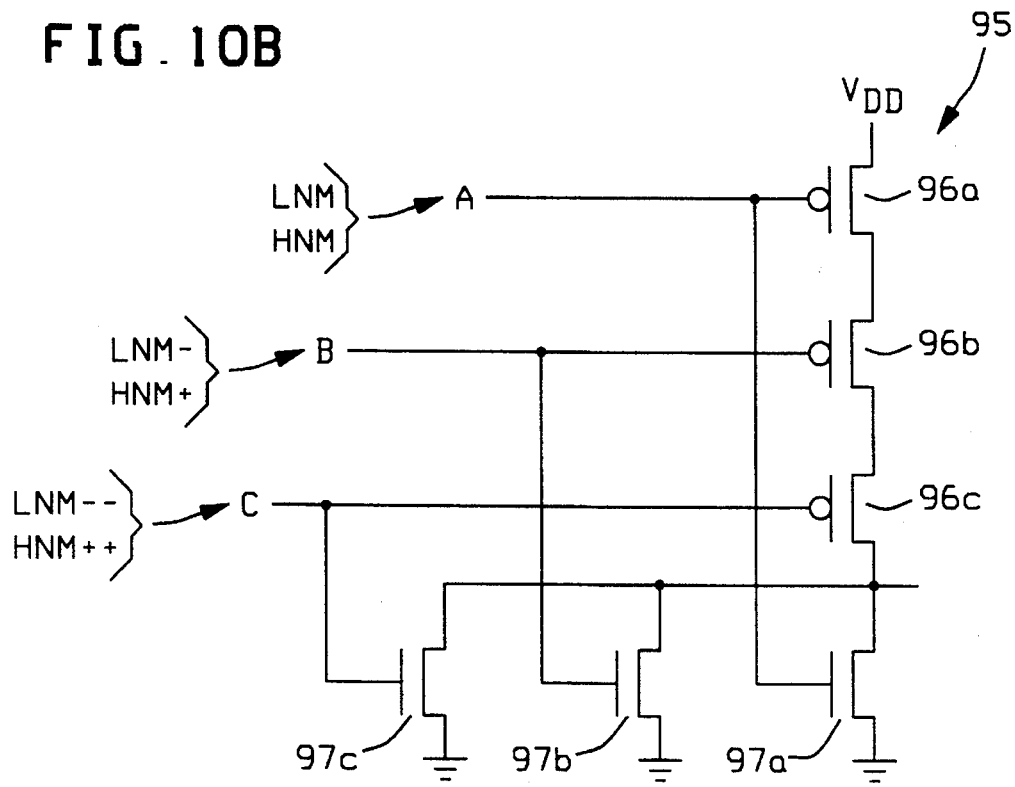

Similarly, in FIG. 10B, reference numeral 95 identifies a NOR gate which has three inputs A, B and C. This NOR gate includes three P-channel transistors 96a–96c which are connected in series and three N-channel transistors 97a–97d which are connected and parallel. Due to the series connection between the P-channel transistors 96a–96c, the effective threshold voltage for each those transistors is different; and that gives a different noise margin to each input.

Input "A" of the NOR gate 91 has the normal high-level noise margin HNM and the normal low-level noise margin LNM. Input "B" has a, bigger high-level noise margin HNM+ than input "A", and a smaller low-level noise margin LNM- than input "A". Input "C" has a bigger high-level noise margin HNM++ than input "B" and a smaller low-level noise margin LNM-than input "B".

After an initial trial layout for an integrated circuit chip is modified by performing one or more of the steps 81–85 of FIG. 9, the equations 61–63 of FIG. 6 are again applied to the modified layout in order to determine if the high-level noise margin and/or the low-level noise margin is exceeded. In making this determination, the FIG. 6 equations are again preferably applied two different ways—once for voltage transitions on the aggressor nets from a "0" to a "1", and once for voltage transitions on the aggressor nets from a "1" to a "0." Then, the sum of the peak crosstalk voltages as estimated from the FIG. 6 equations for the "0" to "1" voltage transition is compared to the available low-level noise margin as given by item 78 in FIG. 8; and the sum of the crosstalk voltages as estimated by the FIG. 6 equations for the "1" to "0" voltage transitions is compared to the available high-level noise margin as given by item 78 in FIG. 8.

All of the above steps of modifying the integrated circuit layout as per FIG. 9, estimating the peak crosstalk voltage which is coupled by all of the aggressor nets into the victim net via the FIG. 6 equations, and comparing the total estimated peak crosstalk voltage in the victim net to the available noise margins as per FIG. 8 are repeated over and over again until both a layout for the chip is reached where both the high-level noise margin and the low-level noise margin is not exceeded. Preferably, those steps are performed for each and every victim net in the entire integrated circuit chip, which for any chip will normally exceed 10,000 nets.

When the above process produces a chip layout in which the crosstalk voltages on all of the victim nets are less than the available high-level and low-level noise margins, that chip layout is sent to an integrated circuit chip foundry where the chip is made. Such a foundry may use any process to build the chip according to the layout which it is provided. For example, the chip could be built with the M5C process from Motorola.

One preferred method of fabricating integrated circuit chips in accordance with the present invention has now been described in detail in conjunction with FIG. 1 thru 10B. In addition, however, many changes and modifications can be made to that particular process without departing from the scope of the present invention.

One particular modification to the above-described process will now be explained in conjunction with FIG. 11. With this modification, the equations 62a and 63a of FIG. 11 respectively replace the equations 62 and 63 of FIG. 6. These new equations 62a and 63a are identical to the equations 62 and 63 except that the parameter $C_W$ is replaced with another parameter $C_N$. This difference is pointed out in FIG. 11 by reference numeral 100.

Parameter $C_N$ is the total capacitance of the victim net as stated by equation 101 in FIG. 11. That is, parameter $C_N$ is the signal line capacitance $C_W$ plus the input capacitance of all load circuits which are in the victim net plus the output capacitance of the driver circuit in the victim net. Thus, parameter $C_N$ as applied to NET1 of FIG. 1 is the total capacitance of the signal line W1 plus the input capacitance of the load circuits $L1_A$ and $L1_B$ plus the output capacitance of the driver circuit D1.

By using the equations 62a and 63a of FIG. 11 in conjunction with equation 61 of FIG. 6, the peak crosstalk voltage which is induced into the victim net is estimated more accurately. This improvement occurs because equations 62 and 63 in FIG. 6 are simplified and ignore effects which load input capacitance and driver output capacitance have on the induced crosstalk voltage.

Next, with reference to FIG. 12, another modification will be described. With this modification, two sets of equations 62b and 63b as shown in FIG. 12 respectively replace the equations 62 and 63 of FIG. 6. Equations 62b and 63b of FIG. 12 are identical to equations 62 and 63 of FIG. 6 with the exception that the term $R_L/2$ is replaced by the term $R_L L_F$. This difference is pointed out in FIG. 12 by reference numeral 110.

Parameter $L_F$ is a location factor which accounts for variations in the location within of the victim net at which crosstalk voltage is induced by an adjacent aggressor net. With the equations 62 and 63 of FIG. 6, a simplification is made whereby all crosstalk voltage is assumed to be coupled into the victim net at one location which is at the center of the signal line. By comparison, in the FIG. 12 equations, the load factor $L_F$ accounts for where the coupling in the victim net actually occurs; and this is achieved by equations 111, 112, and 113 in FIG. 12.

According to equation 111, the location factor $L_F$ is equal to $(L_Y-D_C)/L_Y$. In this expression, $L_Y$ accounts for total length of the signal line in the victim net, and $D_C$ is the distance from the load circuit which is furthest from the driver circuit to the center of the line segment where the capacitive coupling occurs. Note that when the line segment where capacitive coupling occurs is centered in the victim net, then the load factor $L_F$ equals ½; and that makes the equations of FIG. 12 the same as the equations of FIG. 6.

Figure 13:
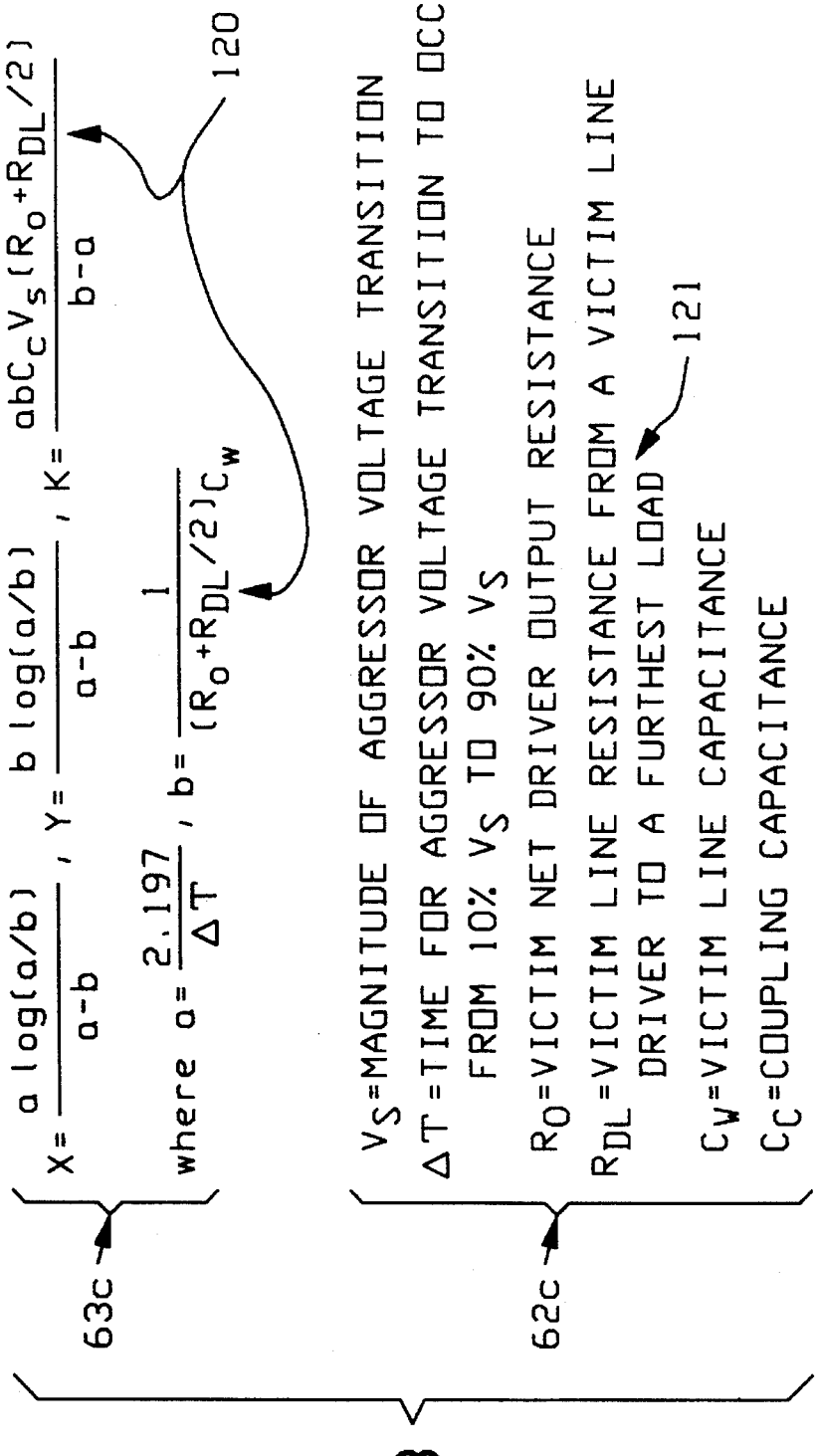
FIG. 13 shows still another modification to the FIG. 6 process of estimating crosstalk voltage, that accounts for various non-serial topologies of the victim net.

As still another modification, the equations 62 and 63 of FIG. 6 are respectively replaced with the equations 62c and 63c of FIG. 13. These FIG. 13 equations 62c and 63c are the same as the equations 62 and 63, except that the parameter $R_L$ is replaced with a new parameter $R_{DL}$. This difference is pointed out in FIG. 13 by reference numeral 120.

With the FIG. 13 equation, variations in the topology of the victim net are accounted for. If the victim net is not a serial net but instead has one or more separate branches, then the parameter $R_{DL}$ of FIG. 13 is the resistance of the signal line between the victim driver circuit and the load circuit which is furthest from the driver. This is stated by equation 121 in FIG. 13. Note that in the case where the victim net has a serial topology, then equations 62c and 63c are identical to the equations 61 and 62.

As yet another modification, the equations 62 and 63 of FIG. 6 are respectively replaced with the equations 62d and 63d of FIG. 14; and in addition, an upper limit is placed on equation 61 of FIG. 6 by equation 61d of FIG. 14. With the modifications of FIG. 14, an improved match is made empirically between the crosstalk voltages as estimated via the equations 61, 61d, 62d, and 63d and the crosstalk voltages as determined by running SPICE simulations on a variety of victim nets and aggressor nets. This improved match is shown by a table in FIG. 15.

One characteristic of all of the above-described processes is that equation 61 of FIG. 6 needs to be evaluated separately for each aggressor net. However, in a basic change which will now be described in conjunction with FIG. 16, an equation 61' is provided which needs to be evaluated only once for all of the aggressor nets combined. Thus, with equation 61', the total processing time is substantially reduced.

In equation 61', the term $V_{PT}$ is an estimation of the total peak crosstalk voltage which all of the aggressor nets together couple into the victim net. To evaluate equation 61', a particular victim net on the integrated circuit chip is selected along with all of the aggressor nets which have line segments adjacent to the victim net. Then, based on a trial layout for the victim net and the aggressor nets, numerical values are assigned to each of the parameters $C_W$, $C_C$, $R_O$, $R_L$, $V_S$ and $\Delta T$ as those parameters are defined by equation 62' of FIG. 16. Then, the products X, Y, a and b of the parameters are formed as given by equations 63' in FIG. 16; and substituting those products into equation 61' yields an estimation of the total peak crosstalk voltage $V_{PT}$ in the victim net.

All of the parameters as defined by the equations 62' of FIG. 16 are the same as the parameters in equations 62 of FIG. 6, except that two parameters $\Delta T$ and $C_C$ are redefined by equations 131 and 132. According to equation 131, the parameter $\Delta T$ is a weighted average of the transition time of the "1" to "0" voltage change (or "0" to "1" voltage change)

which occurs on all of the aggressor nets. In equation 131, the term $\Delta T_1$ is the transition time from 10% $V_S$ to 90% $V_S$ on a first aggressor net, and the term $C_{C1}$ is the coupling capacitance between the first aggressor net and the victim net. Similarly, the term $\Delta T2$ is the transition time from 10% $V_S$ to 90% $V_S$ on a second aggressor net, and the term $C_{C2}$ is the coupling capacitance between the second aggressor net and the victim net; etc. Likewise, in equation 132, the terms $C_{C1}$, $CC_2$, etc., are defined as explained above.

Preferably, the equations 61'–63' of FIG. 16 are applied two different ways to each victim net. In one application, the weighted average transition time $\Delta T$ of equation 131 is selected to be the weighted average transition time from a "0" to a "1" on all of the aggressor nets. Then, in the second application, the weighted average transition time $\Delta T$ of equation 131 is selected to be the transition time from a "1" to a "0" on all of the aggressor nets. Total peak crosstalk voltage as estimated by these two applications of the FIG. 16 equations are then compared to the available noise margin as previously explained in conjunction with FIG. 8; and if this noise margin is exceeded, corrective action is taken in the chip layout as previously explained in conjunction with FIG. 9.

Also, all of the modifications to the base process of FIG. 6, which were described in conjunction with FIGS. 11 through 14 may be incorporated into the base process of FIG. 16. For example, the term $C_W$ in FIG. 16 can be replaced with the term $C_N$ of FIG. 11. Likewise, the term $R_L/2$ in FIG. 16 can be replaced with the term $R_L L_F$ of FIG. 12. With each such modification, the estimate of the total peak crosstalk voltage $V_{PT}$ becomes more accurate; but the process for obtaining that estimation becomes more complex.

Further, it should be pointed out that any combination of the process modifications which were described in conjunction with FIGS. 11 through 14 may be incorporated into the base process of FIG. 6 and/or the base process of FIG. 16. For example, if the process variations of FIGS. 11 and 12 are both incorporated into the process of FIG. 6, then the parameter $C_W$ in FIG. 6 would be replaced with the parameter $C_N$ of FIG. 11; and the parameter $R_L/2$ of FIG. 6 would be replaced with the parameter $R_L L_F$ of FIG. 12. Likewise, if the process modifications of FIGS. 11 and 13 are both incorporated into the process of FIG. 16, then the term $C_W$ in FIG. 16 would be replaced with the term $C_N$ in FIG. 11, and the term $R_L/2$ of FIG. 16 would be replaced with the term $R_D L_l/2$ in FIG. 13.

Turning now to FIGS. 17–24, two completely different base processes which use statistics will be described. One of these base processes uses three equations 161, 162, and 163 as shown in FIG. 17; and the other base process uses equation 161', 162', and 163' of FIG. 23.

Equation 161 in FIG. 17 provides an estimation of the mean (i.e. average) crosstalk voltage $V_M$ which is coupled into a victim net by a voltage transition on an adjacent aggressor net. This is in comparison to the above-described base processes of FIG. 6 and FIG. 16 where peak crosstalk voltage was estimated.

To evaluate equation 161, a particular victim net on an integrated circuit chip is selected along with a particular aggressor net which has a segment that lies next to the victim net. Then, from a trial layout in the integrated circuit chip of the victim net and the aggressor net, numerical values are assigned to each of the parameters which are defined by the equation 162.

All of the parameters of equation 162 are identical to the previously described parameters of equation 62 in FIG. 6, with the exception that one additional parameter $T_{CY}$ is introduced. This new parameter $T_{CY}$ is the cycle time in which transitions occur from a "0" to a "1" (or a "1" to a "0") on the aggressor net. From those parameters, the products X, Y, K, a, and b are formed as defined by the equations 163 of FIG. 17; and substituting those products into the equation 161 yields the estimated mean crosstalk voltage $V_M$ which one particular aggressor net couples into the victim net.

To obtain an estimate of the total mean crosstalk voltage which is coupled into the victim net, the respective mean crosstalk voltages as estimated by equation 161 for each aggressor net are added together. That sum is then compared to the available noise margin, as was previously explained in conjunction with FIG. 8; and if the available noise margin is exceeded, corrective action is taken in the chip layout as previously explained in conjunction with FIG. 9. Here again, the FIG. 17 equations are preferably applied two different ways to each victim net with one application being for transitions from a "0" to a "1" on the aggressor nets and the other application being for transitions from a "1" to a "0" on the aggressor nets.

An important feature of the FIG. 17 equations is the accuracy with which the mean crosstalk voltage is estimated. To measure this accuracy, the present inventor ran SPICE simulations on dozens of victim nets with corresponding aggressor nets; and the mean crosstalk voltage which was obtained by those simulations was compared to the mean crosstalk voltage which obtained via the equations 161–163 of FIG. 17. A table in FIG. 18 shows the results of this comparison.

In a modification to the FIG. 17, a standard deviation SD from the mean crosstalk voltage $V_M$ is estimated for each aggressor net. Then the standard deviations are combined with the mean crosstalk voltages in order to determine whether or not the available noise margin on the victim net is exceeded.

Equation 164 and FIG. 19 provides an estimation of the standard deviation SD from the mean crosstalk voltage $V_M$ which an aggressor net couples into a victim net. Inspection of the equation 164 shows that it is a function of the parameters as defined by the equations 162 of FIG. 17.

After the standard deviation SD and the mean crosstalk voltage $V_M$ are estimated for each aggressor net, those estimations are combined as shown by equation 165 in FIG. 19. All of the terms as combined on the right-hand side of equation 165 together are an estimation of the statistical peak crosstalk voltage $V_{SP}$ which is coupled into the victim net by all of the adjacent aggressor nets. That statistical peak crosstalk voltage $V_{SP}$ is then compared to the available noise margin NM in the victim net; and corrective action is taken if NM>$V_{SP}$ as indicated by equation 166 in FIG. 19.

In the right-hand side of equation 165, the term $V_M$ 1 is the estimated mean crosstalk voltage which is coupled into the victim net by a first aggressor net; the term $V_M$ is the estimated mean crosstalk voltage which is coupled into the victim net by a second aggressor net; etc. Likewise, in the right-hand side of equation 165, the term $SD_1$ is the estimated standard deviation for the mean crosstalk voltage which is coupled into the victim net by the first aggressor net; the term $SD_2$ is the estimated standard deviation for the mean crosstalk voltage which is coupled into the victim net by the second aggressor net; etc.

Equation 165 also includes a term $k_1$ which is a constant that preferably ranges from 1 to 4. As $k_1$ increases, the estimated statistical peak crosstalk voltage $V_{SP}$ is less likely to be exceeded by the actual crosstalk voltage which occurs in the chip that is built. However, the correlation between a particular $k_1$ and the probability of the $V_{SP}$ not being exceeded by the actual crosstalk voltage depends on the shape of the distribution of when the voltage transitions $\Delta T$ occur in all the aggressor nets.

As the number of aggressor nets increases, the distribution of when the transition times occur will usually approach a normal distribution. But for smaller numbers of aggressor nets, the distribution may be skewed. If the distribution is skewed to the right (i.e.—has a tail to the right), then more standard deviations above the mean are needed to get the same probability as one would get from a normal distribution. Conversely, if the distribution is skewed to the left, then fewer standard deviations above the mean are needed to get the same probability as one would get from a normal distribution.

A conservative approach which accounts for a distribution that is skewed to the right is to increase $k_1$ in equation 165 by about 20 percent over the $k_1$ which for a normal distribution gives the desired probability. For example, in a normal distribution, a $k_1$ value of 3 correlates to approximately a 0.9987 probability that the actual peak crosstalk voltage is less than $V_{SP}$ from equation 165. So to get that same probability when the distribution is skewed to the right (or unknown), one would let $k_1$ be 20% larger, or 3.6.

Note that the total statistical peak crosstalk voltage (as given by equation 165 of FIG. 19) must always be smaller than the sum of the peak crosstalk voltages (as given by equations 61 in FIG. 6). This constraint places an upper limit on how large $k_1$ can be in equation 165 of FIG. 19.

Figure 20:
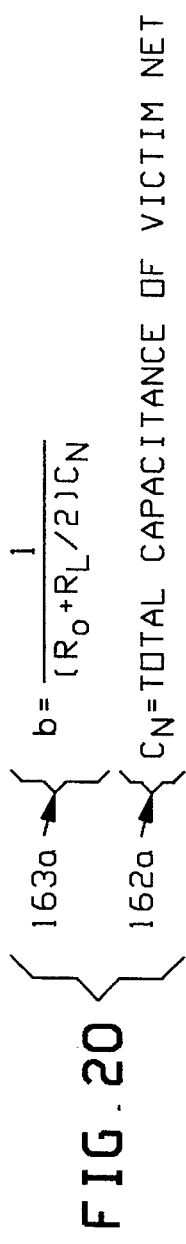
Figure 21:
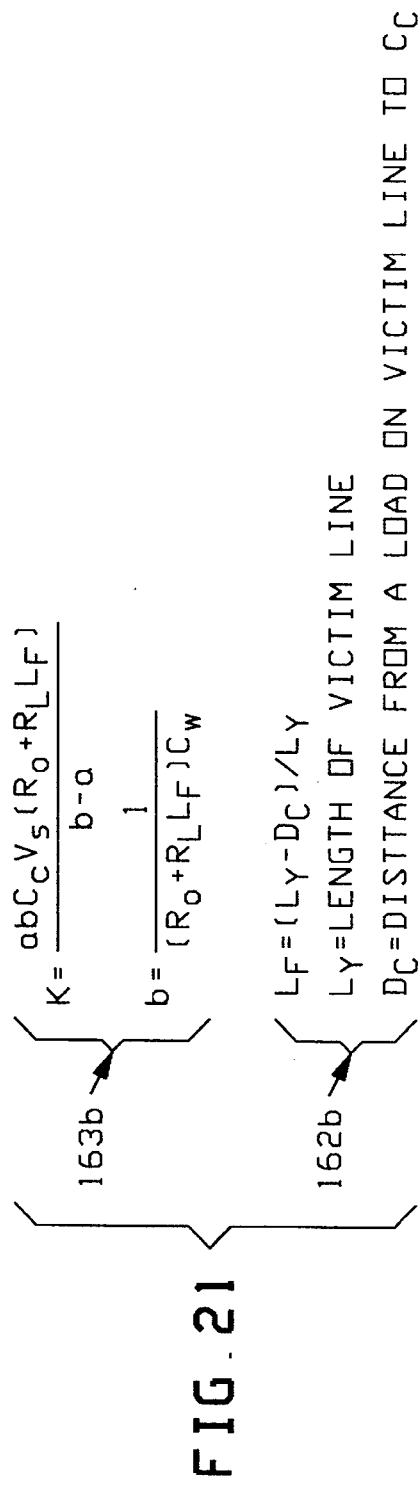
FIG. 21 shows a modification to the processes of FIGS. 17 and 19, that accounts for the location in the victim net at which the coupling from an aggressor net occurs.
Figure 22:
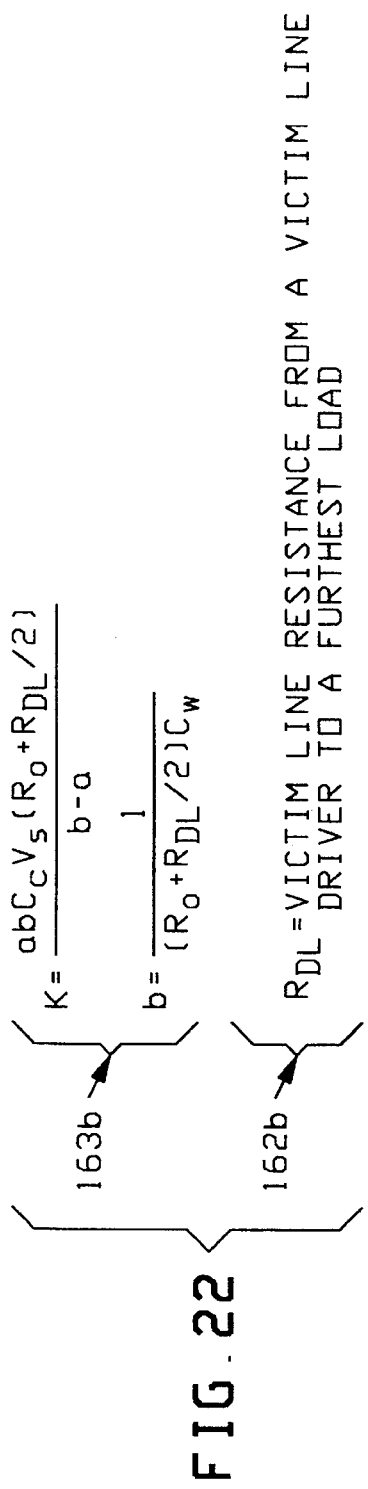
FIG. 22 shows a modification to the processes of FIGS. 17 and 19, which accounts for non-serial topologies of the victim net.

In FIGS. 20, 21 and 22, three additional modifications to the base process of FIG. 17 are shown. These three modifications to the FIG. 17 process are similar to the modifications to the FIG. 6 process which were previously described in conjunction with FIGS. 11, 12, and 13, respectively. That is, the modification of FIG. 20 estimates crosstalk voltage more accurately by utilizing the victim net parameter $C_N$ instead of the parameter $C_W$; the modification of FIG. 21 estimates the crosstalk voltage more accurately by utilizing the victim net parameters $L_F$, $L_Y$, and $D_C$ instead of the parameter $R_L/2$; and the modification of FIG. 22 estimates crosstalk voltage more accurately by utilizing the victim net parameter $R_{DL}$ instead of the parameter $R_L$.

In FIG. 20, equation 162a defines the parameter $C_N$; and equation 163a defines the product term "b" which incorporates the $C_N$ parameter. Here again, parameter $C_N$ is the signal line capacitance $C_W$ plus the input capacitance of all load circuits which are in the victim net plus the output capacitance of the driver circuits in the victim net. With the modification of FIG. 20, parameter $C_N$ of equation 162a is substituted for parameter $C_W$ in equation 162 of FIG. 17; and the product term "b" of equation 163a is substituted for the product term "b" in equation 163 of FIG. 17. After these substitutions are made, the mean crosstalk voltage $V_M$ is estimated by equation 161 of FIG. 17; the standard deviation SD from the mean crosstalk voltage is estimated by equation 164 of FIG. 19; and the statistical peak crosstalk voltage $V_{SP}$ is estimated by equation 165 in FIG. 19.

Similarly, in FIG. 21, equation 162b defines the parameters $L_F$, $L_Y$, and $D_C$; and equation 163b defines the product terms "b" and "K" which incorporate those parameters. With the modification of FIG. 21, the parameters of equation 162b are included in equation 162 of FIG. 17; and the product term "b" and "K" of equation 163b are substituted for the product term "b" and "K" in equation 163 of FIG. 17. After these substitutions are made, the mean crosstalk voltage $V_M$ is estimated by equation 161 of FIG. 17; the standard deviation SD from the mean crosstalk voltage is estimated by equation 164 of FIG. 19; and the statistical peak crosstalk voltage $V_{SP}$ is estimated by equation 165 in FIG. 19.

Likewise, in FIG. 22, equation 162c defines the parameter $R_{DL}$; and equation 163c defines the product terms "b" and "K" which incorporates the $R_{DL}$ parameter. With the modification of FIG. 22, parameter $R_{DL}$ of equation 162c is substituted for parameter $R_L$ in equation 162 of FIG. 17; and the product terms "b" and "K" of equation 163c are substituted for the product terms "b" and "K" in equation 163 of FIG. 17. After these substitutions are made, the mean crosstalk voltage $V_M$ is estimated by equation 161 of FIG. 17; the standard deviation SD from the mean crosstalk voltage is estimated by equation 164 of FIG. 19; and the statistical peak crosstalk voltage $V_{SP}$ is estimated by equation 165 in FIG. 19.

Also, any combination of the process modifications of FIGS. 20–22 may be incorporated into the base process of FIG. 17. For example, if the process variations of FIGS. 20 and 21 are both incorporated into the process of FIG. 17, then the parameter $C_W$ in FIG. 17 would be replaced with the parameter $C_N$ of FIG. 20; and the parameter $R_L/2$ of FIG. 17 would be replaced with the parameter $R_L L_F$ of FIG. 22.

With the base statistical processes of FIG. 17, equation 161 needs to be evaluated separately for each aggressor net. However, with the base statistical process of FIG. 23, an equation 161' is provided which needs to be evaluated only once for all of the aggressor nets combined. That is, in equation 161', the term $V_{MT}$ is an estimation of the total mean crosstalk voltage which all of the aggressor nets together couple into the victim net.

To evaluate equation 161', a particular victim net on the integrated circuit chip is selected along with all of the aggressor nets which have line segments adjacent to the victim net. Then, from a trial layout for the victim net and the aggressor nets, numerical values are assigned to each of the parameters $C_W$, $C_C$, $R_O$, $R_L$, $V_S$ and $\Delta T$ as those parameters are defined by equation 162' of FIG. 23. Then, the products X, Y, a and b of the parameters are formed as given by equations 163' in FIG. 23; and substituting those products into equation 161' yields an estimation of the total mean crosstalk voltage $V_{MT}$ in the victim net.

All of the parameters as defined by the equations 162' of FIG. 23 are the same as the parameters in equations 162 of FIG. 17, except that two parameters $\Delta T$ and $C_C$ are redefined by equations 171 and 172. According to equation 171, the parameter $\Delta T$ is a weighted average of the transition time of the "1" to "0" voltage change (or "0" to "1" voltage change) which occurs on all of the aggressor nets. In equation 171, the term $\Delta T_1$ is the transition time from 10% $V_S$ to 90% $V_S$ on a first aggressor net, and the term $C_{C1}$ is the coupling capacitance between the first aggressor net and the victim net. Similarly, the term $\Delta T2$ is the transition time from 10% $V_S$ to 90% $V_S$ on a second aggressor net, and the term $C_{C2}$ is the coupling capacitance between the second aggressor net and the victim net; etc. Likewise, in equation 172, the terms $C_{C1}$, $C_{C2}$, etc., are defined as explained above.

Preferably, the equations 161'–163' of FIG. 23 are applied two different ways to each victim net. In one application, the weighted average transition time $\Delta T$ of equation 171 is selected to be the weighted average transition time from a "0" to a "1" on all of the aggressor nets. Then, in the second application, the weighted average transition time $\Delta T$ of equation 171 is selected to be the transition time from a "1" to a "0" on all of the aggressor nets. Total mean crosstalk voltage as estimated by these two applications of the FIG. 23 equations are then compared to the available noise margin as previously explained in conjunction with FIG. 8; and if this noise margin is exceeded, corrective action is taken in the chip layout as previously explained in conjunction with FIG. 9.

Also, all of the modifications to the base statistical process of FIG. 17, which were described in conjunction with FIGS. 19 through 22, may be incorporated into the base statistical process of FIG. 23. For example, the equations 164 of FIG. 19 can be combined with the equations 162' and 163' of FIG. 23 to estimate the weighted average standard deviation $SD_{WA}$ from the $V_M T$. To make this estimation, the equations 164 remain unchanged, but the terms "a", and "K" which are in those equations are defined by the equations 162' and 163' of FIG. 23. This is stated in FIG. 24 by an equation 164a.

After, the weighted average standard deviation $SD_{WA}$ is estimated, it is combined with the total mean crosstalk voltage $V_{MT}$ as shown by equation 165a in FIG. 24. Then, the sum SP' of equation 165a is compared to the available noise margin NM as stated by equation 166a in FIG. 24 in order to determine whether or not any corrective faction needs to be taken on the layout of the integrated chip.

In equation 165a, the term $k_1$ is the same constant which occurs in equation 165 of FIG. 19. Thus, $k_1$ again preferably ranges from 1 to 4; and as $k_1$ increase, the sum SP' is less likely to be exceed by the actual crosstalk voltage which occurs in the chip that is built.

Figure 25:
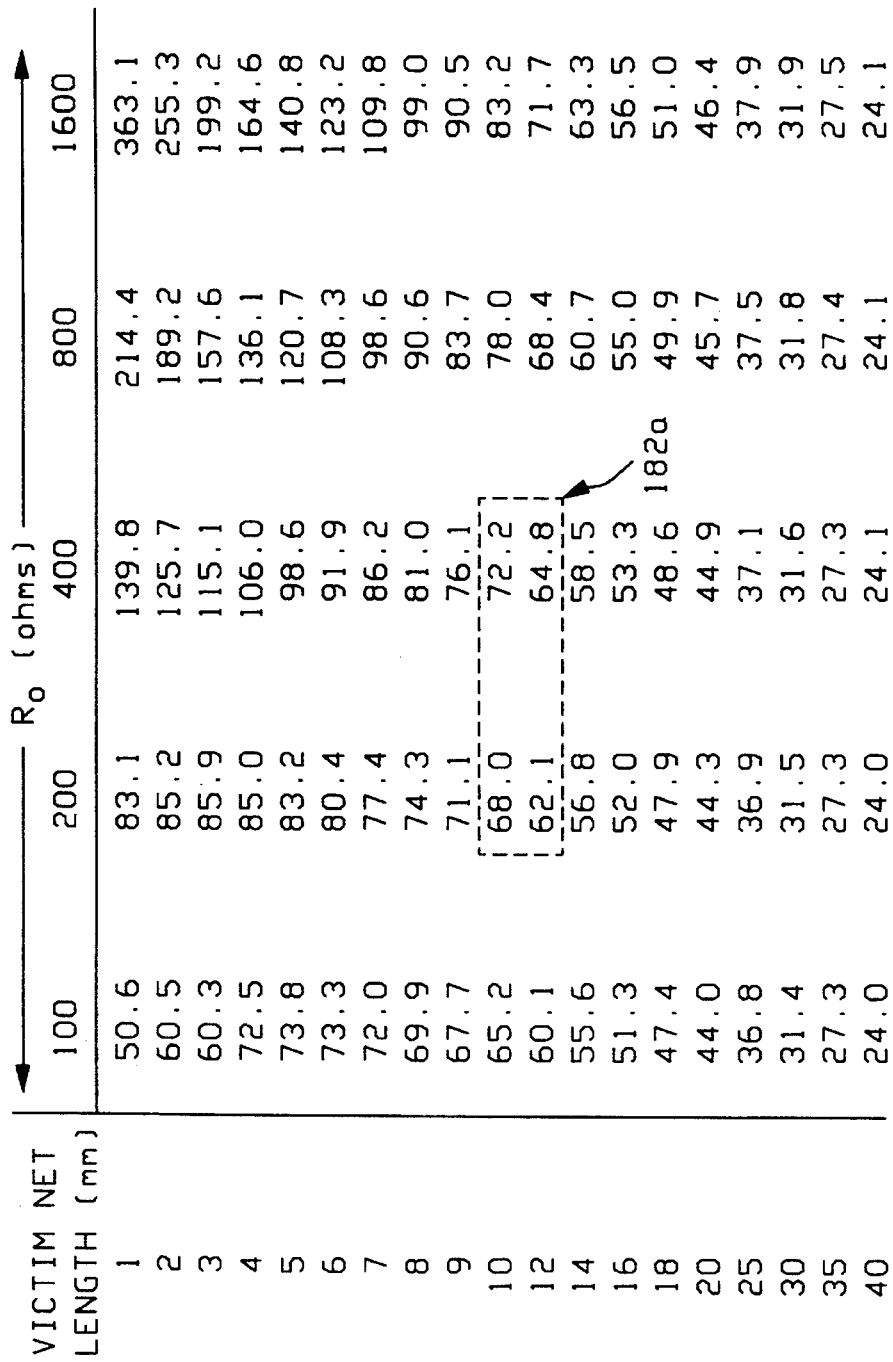
FIG. 25 shows a fifth base method by which peak crosstalk voltage is estimated by employing tables and interpolation.

Referring now to FIGS. 25–28, two additional base processes which use a set of tables will be described. One of these tables is shown in FIG. 25; and each entry in the FIG. 25 table provides an estimation of the peak crosstalk voltage per millimeter $V_{p*}$ which is coupled into the victim net by a voltage transition on an adjacent aggressor net under the following conditions: VS=3.3 volts; $\Delta T$=400 ps; $C_{C*}$=0.05 pf/mm; $R_{L*}$=60 ohm/mm; $C_{W*}$=0.17 pf/mm; the victim net is a serial net; and the coupling from the adjacent aggressor net is centered on the victim net.

In the FIG. 25 table, the parameters $V_S$, $\Delta T$, and $R_O$ are identical to the previously described parameters of equation 62 in FIG. 6. By comparison, parameter $C_{W*}$, is the line capacitance per millimeter of the victim net; parameter $C_{C*}$, is the coupling capacitance to the victim net per millimeter of adjacency between the victim and aggressor nets; and parameter $R_{L*}$, is the line resistance per millimeter of the victim net.

Each of the other tables in the set is identical in form to the FIG. 25 table except that each table is for a different transition time $\Delta T$. For the FIG. 25 table, the transition time $\Delta T$ is 400 picoseconds; and for the other tables, the respective transition times are 100 picoseconds, 200 picoseconds, 300 picoseconds, 500 picoseconds, 1000 picoseconds, 2000 picoseconds, and 4000 picoseconds.

To use the above set of tables, a particular victim net on an integrated circuit chip is selected along with a particular aggressor net which has a line segment that lies next to the victim net. Then, from the trial layout in the integrated circuit chip of the victim net and the aggressor net, numerical values are assigned to each of the parameters which are defined by the equation 182 in FIG. 26.

Note that the numerical values of the parameters $C_{W*}$, $C_{C*}$, $R_{L*}$, and $V_S$ are constant for any one particular integrated circuit technology with which the chip is made. Thus, for each particular victim net and aggressor net on the chip, numerical values for only the parameters $\Delta T$, $R_O$, and $L_V$ need to be determined.

After the parameters of equation 182 are assigned numerical values, two tables are selected from the set which have transition times that border the transition time $\Delta T$ in the aggressor net. For example, if the aggressor net transition time $\Delta T$ is 380 ps, then the FIG. 25 table for $\Delta T$ =400 ps and the similar table for $\Delta T$=300 ps are selected.

Next, an estimate of the peak crosstalk voltage per millimeter $V_{p*}$ which is coupled into the victim net is obtained by reading four adjacent entries from each of the selected tables and interpolating between them. For example, suppose that $\Delta T$=380 ps, $R_o$=300 ohms, and $L_V$=11 mm. In that case, the four entries which are read from the FIG. 25 table are identified by reference numeral 182a; and four similar entries would be read from the table for $\Delta T$=300 ns. From those eight entries, the peak crosstalk voltage per millimeter $V_{p*}$ for $\Delta T$=380 ns, $R_0$=300 ohms, and $L_V$=11 mm is determined by interpolation. That $V_{p*}$ is then multiplied by the length of the aggressor net segment which lies next to the victim net in order to obtain an estimation of the crosstalk voltage $V_p$ which the aggressor net couples into the victim net.

All of the above steps are repeated for each of the aggressor nets; and this is indicated by the equations 183 of FIG. 26. There, $V_{P1*}$ indicates the peak crosstalk voltage per millimeter which the first aggressor net couples into the victim net; $V_{P2*}$, indicates the peak crosstalk voltage per millimeter which a second aggressor net couples into the victim net; etc. Likewise, $L_{C1}$ is the length of the line segment is the first aggressor net which lies next to the victim net; $L_{C2}$ is the length of the line segment in the second aggressor net which lies net to the victim net; etc. To obtain the total peak crosstalk voltage which all of the aggressor nets together couple into the victim net, the voltages $V_{P1}$, $V_{P2}$, etc. from all of the aggressor nets are added together as indicated by equation 184.

After the total peak crosstalk voltage of equation 184 is obtained, it is compared to the available noise margin as was previously explained in conjunction with FIG. 8. If that available noise margin is exceeded, corrective action is taken in the chip layout as was previously explained in conjunction with FIG. 9. Here again, the total peak crosstalk voltage $V_{PT}$ of equation 184 is preferably estimated two different ways in each victim net with one estimation being for transitions from a "0" to a "1" on the aggressor nets, and the other estimation being for transition from a "1" to a "0" on the aggressor nets.

Preferably, the FIG. 25 table is generated just one time by performing a SPICE simulation on each of the different victim net/aggressor net configurations which the table represents. These SPICE simulations will take hours to set up and run; but they only need to be performed one time. After the tables are generated, they are stored in a memory which can be accessed and used thousands of times as needed.

Alternatively, the FIG. 25 table can be generated by evaluating the equations 61–63 of FIG. 6 for each of the different victim net/aggressor net configurations which the table represents. Generating the table in that fashion is substantially faster than generating the table with SPICE simulations; however, with the SPICE simulations the resulting table is more accurate.

Next, a modification to the above described process will be described in conjunction with FIGS. 27A and 27B. With this modification, each of the estimated peak crosstalk voltage $V_{P1}$, $V_{P2}$, etc. as given equation 183 is corrected in accordance with the equations 191 of FIG. 27A. These corrected peak crosstalk voltages $V_{P1C}$, $V_{P2C}$, etc are more accurate because they account for the effects of any input capacitance to the load circuits in the victim net. Then, the corrected peak crosstalk voltages are added together to obtain the total peak crosstalk voltage $V_{PT}$ which is compared to the available noise margin.

Equation 191 contains two new terms $K_C$ and $K_{Ti}$. Term $K_C$ is defined by equation 192 of FIG. 27A as the input capacitance to the load circuits on the victim net divided by the total capacitance $C_N$ of the victim net. By comparison, $K_{Ti}$ is a capacitance correction factor for the i-th aggressor net which is obtained from a second set of tables, one of which is shown in FIG. 27B.

In the FIG. 27B table, all of the parameters $V_S$, $\Delta T$, $R_O$, $C_{W*}$, $C_{C*}$, $R_{L*}$, and $\Delta T$ are identical to the parameters of the FIG. 25 table; and, for each entry in the FIG. 25 table, a corresponding capacitance correction factor $K_{Ti}$ is provided in the FIG. 27B table. For example, for a victim net length of 10 millimeters and a driver circuit output resistance of 400 ohms, $V_{P*}$ from the FIG. 25 table is 72.1 millivolts per millimeter; and the corresponding capacitance correction factor $K_{Ti}$ from the FIG. 27B table is 0.837.

To generate the FIG. 27B table, one of the equations 191 is rewritten as equation 193 wherein $K_T$ is expressed as a function of $K_C$, $V_P$, and $V_{PC}$. Then, for each entry in the FIG. 27B table that is to be generated, values for KC, $V_P$ and $V_{PC}$ are obtained and substituted into the equation 193.

Values for $K_C$ in equation 193 are obtained by utilizing equation 192 which says $K_C = C_{in}/C_N$. To obtain $C_{in}$, a "typical" $C_{in}$ is selected for each row in the FIG. 27B table. Usually in a chip, a long victim net will have more loads than a short net; so the typical $C_{in}$ preferably is selected such that it increases with victim net length. For example, $C_{in}$ could be selected as a constant times $C_W$ where $C_W = (C_{W*})(L_V)$. The, $C_N$ is obtained from the relation $C_N = C_{in} + C_W$.

Values for $V_P$ in equation 193 are obtained by evaluating the equations 61, 62 and 63 of FIG. 6; and values for $V_{PC}$ in equation 193 are obtained by evaluating equation 61 of FIG. 6 and equations 62a and 63a of FIG. 11. Alternatively, the value for $V_P$ in equation 193 may be obtained by a SPICE simulation with $C_{in}=0$; and the value for $V_p$ in equation 193 may be obtained by a SPICE simulation with $C_{in}$ selected as described above.

Turning now to FIG. 28, a second base process which uses the tables of FIG. 25 will be described. With this base process, a weighted average transition time $\Delta T$, as given by equation 201 in FIG. 28, is determined for all of the aggressor nets which lie next to a victim net. All of the terms in equation 201 are the same as was previously described for equation 131 of FIG. 16. That is, $C_{Ci}$ is the coupling capacitance between the i-th aggressor net and the victim net; and $\Delta T_i$ is the time for a voltage transition to occur on the i-th aggressor net.

After the weighted average transition time of equation 201 is determined for all of the aggressor nets which lie next to a particular victim net, that weighted average transition time is used to select two tables from the set which was illustrated by the FIG. 25 table. Here again, the two tables which are selected are those which have transition times that border the weighted average transition time as given by equation 201. For example, if the weighted average transition time is 425 picoseconds, then the FIG. 25 table for $\Delta T=400$ picoseconds and the similar table for $\Delta T=500$ picoseconds are selected.

Next, an estimate of the weighted average peak crosstalk voltage per millimeter which is coupled into the victim net is obtained by reading four entries from each of the selected tables and interpolating between them. Then, that weighted average peak crosstalk voltage per millimeter is multiplied by the sum of the lengths of all of the aggressor net segments which lie next to the victim net in order to obtain an estimation of a total peak crosstalk voltage which all of the aggressor nets couple into the victim net. These steps are stated by equations 202 and 203 in FIG. 28.

Thereafter, the total peak crosstalk voltage of equation 203 is compared to the noise margin as was previously explained in conjunction with FIG. 8. If that available noise margin is exceeded, corrective action is taken in the chip layout as was previously explained in conjunction with FIG. 9. Again, the total peak crosstalk voltage $V_{PT}$ of equation 203 is preferably estimated two different ways in each victim net with one estimation being for transitions from a "0" to a "1" on the aggressor nets, and the other estimation being for a transition from a "1" to a "0" on the aggressor nets.

A primary feature of the above-described process is that the peak crosstalk voltage in a particular victim net is estimated by reading entries in just two tables and performing just one interpolation on those entries. By comparison, with the process which uses equations 183 and 184 of FIG. 26, two tables need to be read and one interpolation needs to be performed for each aggressor net which lies next to the victim net.

As a modification to the FIG. 28 process, the peak crosstalk voltage $V_{PT}$ of equation 203 may be corrected to compensate for the input capacitance of the load circuits in the victim net. With this modification, $V_{PT}$ of equation 203 is multiplied by one of the equations 191 of FIG. 27A. Here again, the term $K_C$ in equation 191 is defined as the ratio $C_{in}/C_N$; and the term $K_T$ is read from a table such as the table in FIG. 27b.

As another modification to the FIG. 28 process, the total peak crosstalk voltage $V_{PT}$ as given by equation 203 may be multiplied by a statistical correction finder $K_S$ as stated by equation 204. This product of $K_S V_{PT}$ is an estimation of the statistical peak crosstalk voltage SP which all of the aggressor nets together couple into the victim net. This estimation of equation 204 is similar to the statistical peak crosstalk voltage which was previously estimated by equation 165 of FIG. 19.

To obtain the statistical correction factor $K_S$ of equation 204, a set of tables is provided; one of which is shown in FIG. 29. That particular table corresponds to a weighted average transition time $\Delta T$ of 400 picoseconds; and similar tables are provided for other transition times such as $\Delta T=100$ picoseconds, 200 picoseconds, 300 picoseconds, 500 picoseconds, 1000 picoseconds, 2000 picoseconds, and 4000 picoseconds.

Preferably, each entry in the FIG. 29 table is generated by starting with equation 61 of FIG. 6 and equation 165 of FIG. 19 and working backwards. That is, equation 61 of FIG. 6 is used to estimate the peak crosstalk voltage which each aggressor net couples into the victim net, and those peak voltages are added together to get the total peak crosstalk voltage which is substituted for the term $V_{PT}$ in equation 204 of FIG. 28. Then, equation 165 of FIG. 19 is used to estimate the statistical peak crosstalk voltage SP which is coupled into the victim net; and that estimated value is substituted for the term SP in equation 204 of FIG. 28. Then, the statistical correction factor $K_S$ is determined as the ratio $SP/V_{PT}$. Alternatively, SPICE simulations can be run to obtain estimated values for $V_{PT}$ and SP in equation 204.

In such SPICE simulations and/or in using the equations 61 and 165 as described above, several parameters need to be selected with "typical" values. These parameters include: a "typical" cycle time $T_{CY}$, a "typical" number of aggressor nets per victim net; a "typical" length for the line segments of the aggressor nets which lie next to the victim net; etc. Preferably, the number of aggressor nets increases as the victim net length increases.

Several preferred methods of fabricating integrated circuit chips have now been described in detail wherein crosstalk voltages are insured to not exceed an available noise margin. In addition, however, many changes and modifications can be made to the above-described details without departing from the nature and spirit of the invention.

For example, all of the steps which have been described herein for estimating the crosstalk voltage that is coupled into a victim net may be performed automatically by any computer program in any digital computer. Preferably, that program also generates a report which identifies the victim nets which exceed the available noise margin. One such report from an actual computer program which uses the present invention is shown in FIGS. 30A and 30B.

All of the items which are shown in FIG. 30A apply to a particular victim net whose signal name is given by item 210. When the driver circuit on the victim net 210 is generating a "1", the total available noise margin is given by item 211a; the total peak crosstalk voltage $V_{PT}$ which is coupled into the victim net by all adjacent aggressor nets is given by item 211b; and the statistical peak crosstalk voltage SP which is coupled into the victim net by all adjacent aggressor nets is given by item 211c. Likewise, when the driver circuit on the victim net is generating a "0", the total available noise margin is given by item 212a; the total peak crosstalk voltage which is coupled into the victim net is given by items 212b; and the statistical peak crosstalk voltage which is coupled into the victim net is given by item 212c.

To estimate the total peak crosstalk voltages 211b and 212b, equation 61 of FIG. 6 along with equations 62a and 62b of FIG. 11 were used. To estimate the total statistical peak crosstalk voltages 211c and 211d, equation 161 of FIG. 17 along with equations 164 and 165 of FIG. 19 and equation 163a and 163b were used.

Item 211d of FIG. 30A is the difference between the noise margin 211a and the statistical peak crosstalk voltage 211c. Similarly, item 211d is the difference between the available noise margin 212a and the statistical peak crosstalk voltage 212c. Inspection of item 211d shows that the available noise margin is exceeded when the driver of the victim net is generating a "1"; and thus corrective action needs to be taken as was previously described in conjunction with FIG. 9. By comparison, inspection of item 212d shows that the available noise margin is not exceeded when the driver of the victim net is generating a "0".

Also in FIG. 30A, item 213a gives the output resistance $R_o$ of the driver circuit for the victim net when that circuit is generating a "1"; and item 213b gives the output resistance $R_o$ of the driver circuit for the victim net when that circuit is generating a "0". Item 213c gives a name which identifies the particular circuit that is driving the victim net. Item 214 gives the total length of the victim net in microns; and item 215 gives the total number of aggressor nets which have line segments that lie next to the victim net.

In FIG. 30B, all of the items which are shown apply to one of the aggressor nets that lie next to the victim net of FIG. 30A. Item 220 is the name of the aggressor net. Item 221 is the length of the line segment in the aggressor net 220 which lies next to the victim net. Item 222a is the transition time $\Delta T$ for a "0" to a "1" voltage change on the aggressor net; and item 222b is the transition time $\Delta T$ for a "1" to a "0" voltage transition on the aggressor net. Each of these transitions is from 10% $v_S$ to 90% $v_S$.

Item 223a is an estimation of the peak crosstalk voltage which is coupled into the victim net 210 due to the voltage transition 222a on the aggressor net 220. Similarly, item 223b is an estimation of the peak crosstalk voltage which is coupled into the victim net 210 due to the voltage transition 222b on the aggressor net 220. These peak crosstalk voltages 223a and 223b are estimated by equation 61 of FIG. 6 together with equations 62a and 62b of FIG. 11. Also in FIG. 30B, item 224 gives the total length of the aggressor net 220 in microns; item 225 gives the total number of loads on the aggressor net; and item 226 gives a name which identifies the particular driver circuit in the aggressor net.

Preferably, the report of FIGS. 30A and 30B is generated for each victim net and its corresponding aggressor nets where noise margin is exceeded. Then, the report may be analyzed by a chip designer; and he can manually select any one of the corrective steps 81–85 of FIG. 9 in order to reduce the magnitude of the crosstalk voltage below the available noise margin. Alternatively, similar steps can be performed automatically with no manual intervention. That is, the computer program can examine the items 211d and 212d of FIG. 30A to determine if the available noise margin is exceeded; and if it is, the computer program can automatically invoke one of the corrective steps 81–85 of FIG. 9.

As another variation, in all of the steps which have been described herein for estimating the crosstalk voltage that is coupled into victim net, the capacitive coupling per unit length between a victim net and an aggressor net may not be a constant. Instead, the capacitive coupling per unit length can vary from one metal layer to another. Thus, when a victim net signal line and an adjacent aggressor net signal line are patterned from the first layer of metal, $C_{C*}$, can have one value; and when a victim net signal line and an adjacent aggressor net signal line are patterned from a second layer of metal, $C_{C*}$, can have a different value. Likewise, if additional layers of metal such as third layer metal and fourth layer metal are provided from which the victim net and aggressor net signal lines are structured, the capacitive coupling $C_{C*}$, for those layers can each have a different value.

Similarly, the capacitance $C_S$ between a signal line and any circuit structures which are at a constant voltage can have a different value per unit length depending upon the particular layers of metal from which the signal line and the other circuit structures are made. For example, the capacitance $C_S$ between a signal line and the semiconductor substrate can have one value per unit length when the signal line is made of first layer metal, and have a different value per unit length when the signal line is made of second layer metal. Likewise, if the signal line is patterned from a third layer of metal, then the capacitance $C_S$ can have one value per unit length between it and the underlying semiconductor substrate; and it can have another value per unit length between itself and a constant voltage conductor which is patterned from an underlying first layer metal.

As still another variation, consider the corrective step 84 of FIG. 9 wherein Capacitance is added to a signal line to reduce crosstalk voltage. In the case where the signal line is constructed of second layer metal and a vacant area exists under that signal line which contains no first layer metal, then capacitance can be added to the signal line by adding a first layer metal ground line in that vacant area. Likewise, in the case where the signal line is made of first layer metal and a vacant area exists above that signal line which contains no second layer metal, then capacitance can be added to the signal line by adding a second layer metal ground line in that vacant area. Similarly, if a portion of the signal line is made of an i-th layer metal and a vacant area lies next to the signal line, then capacitance can be added to the signal line by adding an i-th layer metal ground conductor which lies next to the signal line.

As a related variation, the signal lines can be patterned from more than two layers of metal. For example, they can be patterned from first, second, third, and fourth metal layers. In that case, the adding of capacitance to a signal line per the corrective step 84 of FIG. 9, can be performed by adding a ground conductor, which is made from any of the metal layers, in a vacant area near the signal line.

For example, consider a case where the victim signal line is made of third layer metal, the aggressor signal line lies directly under the victim signal line and is made of first layer metal, a vacant area in the second layer metal lies between the victim and aggressor signal lines. In that case, adding a ground conductor, which is made from second layer metal in the vacant area, will increase the capacitance $C_S$ of the victim line and it will also greatly reduce the capacitance $C_C$ between the victim and aggressor signal lines.

As yet another variation, the transition time $\Delta T$ from "0" to "1" or "1" to "0" on an aggressor net, can be expressed in a different but equivalent fashion. In all of the equations 62, 62a, etc., which define $\Delta T$, the term is stated to be the time for the transition to occur from 10% $V_S$ to 90% $V_S$. However, as an equivalent alternative, $\Delta T$ can be redefined as the time for a transition to occur from 20% $V_S$ to 80% $V_S$.

In more general terms, $\Delta T$ can be redefined as the transition time between a small level "SL" and a large level "LL". When $\Delta T$ is redefined in this fashion, all that changes is the expression for the product term "a" in equations 63, 63a, 63b, etc., which use $\Delta T$. Specifically, in those equations, the constant "2.197" gets replaced with Log (LL/$V_S$)–Log (SL/$V_S$). With that replacement, the value of "a" remains unchanged.

As still another variation, the crosstalk voltage which is coupled into a victim net may be estimated as a combination of the peak crosstalk voltages $V_P$ which are coupled from some selected aggressor nets plus the statistical peak crosstalk voltages SP which are coupled from the remaining aggressor nets. For example, the peak crosstalk voltages $V_P$ from the three aggressor nets with the largest coupling capacitance can be estimated by the FIG. 6 equations, and they can be added to the statistical peak crosstalk voltages of the remaining aggressor nets as estimated from the FIG. 19 equations.

As an additional variation, the methods for estimating mean crosstalk voltages and standard deviations therefrom, which were explained in conjunction with FIGS. 17–24, can be improved in accuracy by employing an empirical correction factor. Recall that a similar correction factor, for estimating peak crosstalk voltages, was previously described in conjunction with FIG. 14. To apply the FIG. 14 empirical correction factor to mean crosstalk voltages and standard deviations, simply replace the expression for the product term "b" in FIG. 17 and 19 with the expression for "b" in FIG. 14.

Accordingly, it is to be understood that the invention is not limited to the details of any one particular method which has been described above but is defined by the appended claims.

What is claimed is:

1. A method of fabricating an integrated circuit chip, which contains a victim net and a set of aggressor nets with each aggressor net having a line segment that lies next to said victim net, such that crosstalk voltages coupled to said victim and aggressor nets are within an acceptable level; said method including the steps of:

providing a trial layout for said victim net and said aggressor nets;

assigning to said trial layout of said victim net, the parameters of—a line capacitance, a line resistance, and a driver output resistance; and assigning to said trial layout of each aggressor net, the parameters of—a coupling capacitance to said victim net, a voltage transition, and a cycle time for said transition;

estimating, for each aggressor net, a respective mean crosstalk voltage $V_M$ which the aggressor net couples into said victim net as a function $$V_M = K \left\{ \frac{(1-e^x)}{x} - \frac{(1-e^y)}{y} \right\}$$

where K, X, and Y are products of said parameters;

modifying said trial layout and repeating said assigning and estimating steps until a summation of the estimated mean crosstalk voltages in the victim net is within said acceptable level; and, building said chip with the modified layout for which said summation is within said acceptable level.

2. A method according to claim 1 wherein said estimating step is performed with:

$$X = aT_{cy}, \quad Y = bT_{cy}, \quad K = \frac{abC_cV_s(R_o + R_L/2)}{b-a},$$

$$\text{where} \quad a = \frac{2.197}{\Delta T},$$

$$b = \frac{1}{(R_o + R_L/2)C_w},$$

$V_s$=magnitude of said voltage transition, $\Delta_T$=time for said voltage transition to occur from 10% $V_S$ to 90% $V_S$, $R_o$=said victim net driver output resistance, $R_L$=said victim line resistance, $C_w$=said victim line capacitance, $C_c$=said coupling capacitance, and, $T_{cy}$=said transition cycle time.

3. A method according to claim 1 wherein said estimating step is performed with:

$$X = aT_{cy}, \quad Y = bT_{cy}, \quad K = \frac{abC_cV_s(R_o + R_L/2)}{b-a},$$

$$\text{where} \quad a = \frac{2.197}{\Delta T},$$

$$b = \frac{1}{(R_o + R_L/2)C_N},$$

$V_s$=magnitude of said voltage transition, $\Delta_T$=time for said voltage transition to occur from 10% $V_S$ to 90% $V_S$, $R_o$=said victim net driver output resistance, $R_L$=said victim line resistance, $C_N$=said victim line capacitance plus any additional capacitance of said victim net, $C_c$=said coupling capacitance, and $T_{cy}$=said transition cycle time.

4. A method according to claim 1 wherein said estimating step is performed with:

$$X = aT_{cy}, \quad Y = bT_{cy}, \quad K = \frac{abC_cV_s(R_o + R_LL_F)}{b-a},$$

$$\text{where} \quad a = \frac{2.197}{\Delta T},$$

$$b = \frac{1}{(R_o + R_LL_F)C_w},$$

$V_s$=magnitude of said voltage transition, $\Delta_T$=time for said voltage transition to occur from 10% $V_S$ to 90% $V_S$, $R_o$=said victim net driver output resistance, $R_k$=said victim line resistance, $C_w$=said victim line capacitance, $C_c$=said coupling capacitance, $L_F=(L_y-D_C)/L_Y$ $L_Y$=length of said victim line, $D_C$=distance from a load on said victim line to $C_C$, and $T_{CY}$=said transition cycle time.

5. A method according to claim 1 wherein said estimating step is performed with:

$$X = aT_{cy}, \quad Y = bT_{cy}, \quad K = \frac{abC_cV_s(R_o + R_{DL}/2)}{b-a},$$

$$\text{where} \quad a = \frac{2.197}{\Delta T},$$

$$b = \frac{1}{(R_o + R_{DL}/2)C_w},$$

$V_S$=magnitude of said voltage transition, $\Delta_T$=time for said voltage transition to occur from 10% $V_S$ to 90% $V_S$, $R_o$=said victim net driver output resistance, $R_{DL}$=said victim line resistance from a victim line driver to a to furthest load, $C_w$=said victim line capacitance, $C_c$=said coupling capacitance, and $T_{cy}$=said transition cycle time.

6. A method according to claim 1 wherein said modifying step includes moving an aggressor net such that said segment which lies next to said victim net is shortened.

7. A method according to claim 1 wherein said modifying step includes changing a driver circuit in said victim net such that said driver output resistance is reduced.

8. A method according to claim 1 wherein said modifying step includes adding capacitance to said victim net and/or aggressor net.

9. A method according to claim 1 wherein said modifying step includes switching said victim line from one input on a load to another input which has a larger noise margin than said one input.

10. A method according to claim 1 wherein said modifying step includes inserting a repeater circuit into said victim line.

11. A method according to claim 1 wherein said steps of assigning, estimating, and modifying are performed with said voltage transition being from a high voltage to a low voltage; and wherein those same steps are performed again with said voltage transition being from a low voltage to a high voltage.

12. A method according to claim 1 wherein said steps of assigning, estimating, and modifying are performed at least ten-thousand times, with each such performance involving a different victim net and set of aggressor nets in said chip.

13. A method according to claim 1 wherein said summation is of the form $$\Sigma V_{Mi} + k_1 \sqrt{\Sigma(SD_i)^2},$$

where:

$V_{Mi}$ is said respective mean voltage for one particular aggressor net;

$SD_i$ is a standard deviation from $V_{Mi}$ for said one particular aggressor net; and, $k_1$ is a constant in the range of 1 to 4.

14. A method of fabricating an integrated circuit chip, which contains a victim net and a set of aggressor nets with each aggressor net having a line segment that lies next to said victim net, such that crosstalk voltages coupled to said victim and aggressor nets are within an acceptable level; said method including the steps of:

providing a trial layout for said victim net and said aggressor nets;

assigning to said trial layout of said victim net, the parameters of—a line capacitance, a line resistance, and a driver output resistance; and assigning to said trial layout of said aggressor nets, the parameters of—a total coupling capacitance of all aggressor nets to said victim net, a weighted average voltage transition on all aggressor nets, and a cycle time for said transition;

estimating, a total mean crosstalk voltage $V_{MT}$ which all aggressor nets together coupled into said victim net as a function $$V_{MT} = K \left\{ \frac{(1-e^x)}{x} - \frac{(1-e^y)}{y} \right\}$$

where K, X, and Y are products of said parameters;

modifying said trial layout and repeating said assigning and estimating steps until said estimated total mean crosstalk voltage in the victim net is within said acceptable level; and, building said chip with the modified layout for which said estimated total mean crosstalk voltage is within said acceptable level.

15. A method according to claim 14 wherein said estimating step is performed with:

$$X = aT_{cy}, \quad Y = bT_{cy}, \quad K = \frac{abC_cV_s(R_o + R_L/2)}{b-a},$$

$$\text{where} \quad a = \frac{2.197}{\Delta T},$$

$$b = \frac{1}{(R_o + R_L/2)C_w},$$

$V_s$=magnitude of said voltage transition, $\Delta T$=time for said voltage transition to occur from 10% $V_S$ to 90% $V_S$, $R_o$=said victim net driver output resistance, $R_L$=said victim line resistance, $C_w$=said victim line capacitance, $C_c$=said coupling capacitance, and, $T_{cy}$=said transition cycle time.

16. A method according to claim 14 wherein said estimating step is performed with:

$$X = aT_{cy}, \quad Y = bT_{cy}, \quad K = \frac{abC_cV_s(R_o + R_L/2)}{b - a},$$

$$\text{where} \quad a = \frac{2.197}{\Delta T},$$

$$b = \frac{1}{(R_o + R_L/2)C_N},$$

$V_s$=magnitude of said voltage transition,
$\Delta T$=time for said voltage transition to occur from 10% $V_S$ to 90% $V_S$,
$R_o$=said victim net driver output resistance,
$R_L$=said victim line resistance,
$C_N$=said victim line capacitance plus any additional capacitance of said victim net,
$C_c$=said coupling capacitance, and
$T_C$=said transition cycle time 17. A method according to claim 14 wherein said estimating step is performed with:

$$X = T_{cy}, \quad Y = bT_{cy}, \quad K = \frac{abC_cV_s(R_o + R_LL_F)}{b - a},$$

$$\text{where} \quad a = \frac{2.197}{\Delta T},$$

$$b = \frac{1}{(R_o + R_LL_F)C_w},$$

$V_s$=magnitude of said voltage transition,
$\Delta T$=time for said voltage transition to occur from 10% $V_S$ to 90% $V_S$,
$R_o$=said victim net driver output resistance,
$R_L$=said victim line resistance,
$C_w$=said victim line capacitance,
$C_o$=said coupling capacitance,
$L_F=(L_Y-D_C)/L_Y$
$L_y$=length of said victim line,
$D_C$=distance from a load on said victim line to $C_C$, and
$T_{cy}$=said transition cycle time 18. A method according to claim 14 wherein said estimating step is performed with:

$$X = aT_{cy}, \quad Y = bT_{cy}, \quad K = \frac{abC_cV_s(R_o + R_{DL}/2)}{b - a},$$

$$\text{where} \quad a = \frac{2.197}{\Delta T},$$

$$b = \frac{1}{(R_o + R_{DL}/2)C_w},$$

$v_s$=magnitude of said voltage transition,
$\Delta T$=time for said voltage transition to occur from 10% $V_S$ to 90% $V_S$,
$R_o$=said victim net driver output resistance,
$R_{DL}$=said victim line resistance from a victim line driver to a to furthest load,
$C_w$=said victim line capacitance,
$C_o$=said coupling capacitance, and
$T_{cy}$=said transition cycle time.

19. A method according to claim 14 wherein said modifying step includes moving an aggressor net such that said segment which lies next to said victim net is shortened.

20. A method according to claim 14 wherein said modifying step includes changing a driver circuit in said victim net such that said driver output resistance is reduced.

21. A method according to claim 14 wherein said modifying step includes adding capacitance to said victim net and/or aggressor net.

22. A method according to claim 14 wherein said modifying step includes switching said victim line from one input on a load to another input which has a larger noise margin than said one input.

23. A method according to claim 14 wherein said modifying step includes inserting a repeater circuit into said victim line.

24. A method according to claim 14 wherein said steps of assigning, estimating, and modifying are performed with said voltage transition being from a high voltage to a low voltage; and wherein those same steps are performed again with said voltage transition being from a low voltage to a high voltage.

25. A method according to claim 14 wherein said steps of assigning, estimating, and modifying are performed at least ten-thousand times, with each such performance involving a different victim net and set of aggressor nets in said chip.

26. A method according to claim 14 wherein said weighted average voltage transition is $\Sigma D_{Ci}\Delta T_i + \Sigma C_{Ci}$;

where—$C_{Ci}$ is a respective coupling capacitance of said line segment for a particular aggressor net i which lies net to said victim net; and $\Delta T_i$ is a respective time for a voltage transition to occur in said aggressor net i.

27. A method according to claim 14 wherein said estimated total mean crosstalk voltage is of the form $V_{MT} + k_1(SD_{WA})$ where $SD_{WA}$ is a weighted average standard deviation from $V_{MT}$, and $k_1$ is a constant in the range of 1 to 4.

\* \* \* \* \*